(12) United States Patent
Okamoto et al.

(10) Patent No.: US 6,774,674 B2
(45) Date of Patent: Aug. 10, 2004

(54) SEMICONDUCTOR DEVICE

(75) Inventors: Kazuaki Okamoto, Tokyo (JP); Toru Araki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 53 days.

(21) Appl. No.: 10/196,228

(22) Filed: Jul. 17, 2002

(65) Prior Publication Data

US 2003/0016054 A1 Jan. 23, 2003

(30) Foreign Application Priority Data

Jul. 19, 2001 (JP) .......................................... 2001-219593
Feb. 26, 2002 (JP) .......................................... 2002-049426

(51) Int. Cl.[7] .......................................... H03K 19/0175
(52) U.S. Cl. .......................... 326/80; 326/27; 326/82
(58) Field of Search ................................ 326/79, 68, 63, 326/62, 80, 87; 327/112, 311, 381, 388, 427

(56) References Cited

U.S. PATENT DOCUMENTS 5,134,322 A * 7/1992 Bourgeois et al. .......... 307/571
5,514,981 A * 5/1996 Tam et al. .................... 326/80
5,917,359 A   6/1999 Fukunaga et al.
6,531,894 B2 * 3/2003 Watabe ........................ 326/82

FOREIGN PATENT DOCUMENTS

JP    07-297698    11/1995
JP    9-200017     7/1997

* cited by examiner

Primary Examiner—Anh Q. Tran
(74) Attorney, Agent, or Firm—Oblon, Spivak, McClelland, Maier & Neustadt, P.C.

(57) ABSTRACT

A high-potential side power device driving circuit has a clock signal generation circuit generating the so-called internal clock signal by outputting a pulse in a constant cycle for driving NMOS transistors and an iterative pulse generation circuit monitoring the state of an external input signal in synchronization with an output signal of the clock signal generation circuit, receiving a pulsing input signal generated with reference to a ground potential and generating pulsing ON and OFF signals. Thus provided is a level shifting circuit capable of preventing a power device from a malfunction also when a dv/dt transient signal is supplied with time difference.

20 Claims, 30 Drawing Sheets

F I G. 9
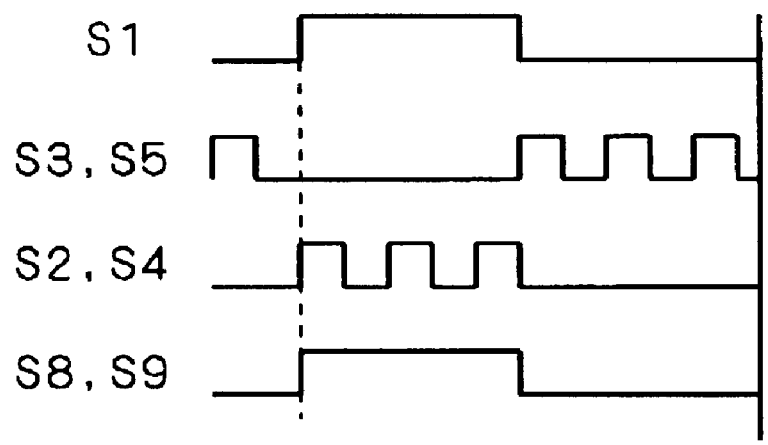

F I G. 20
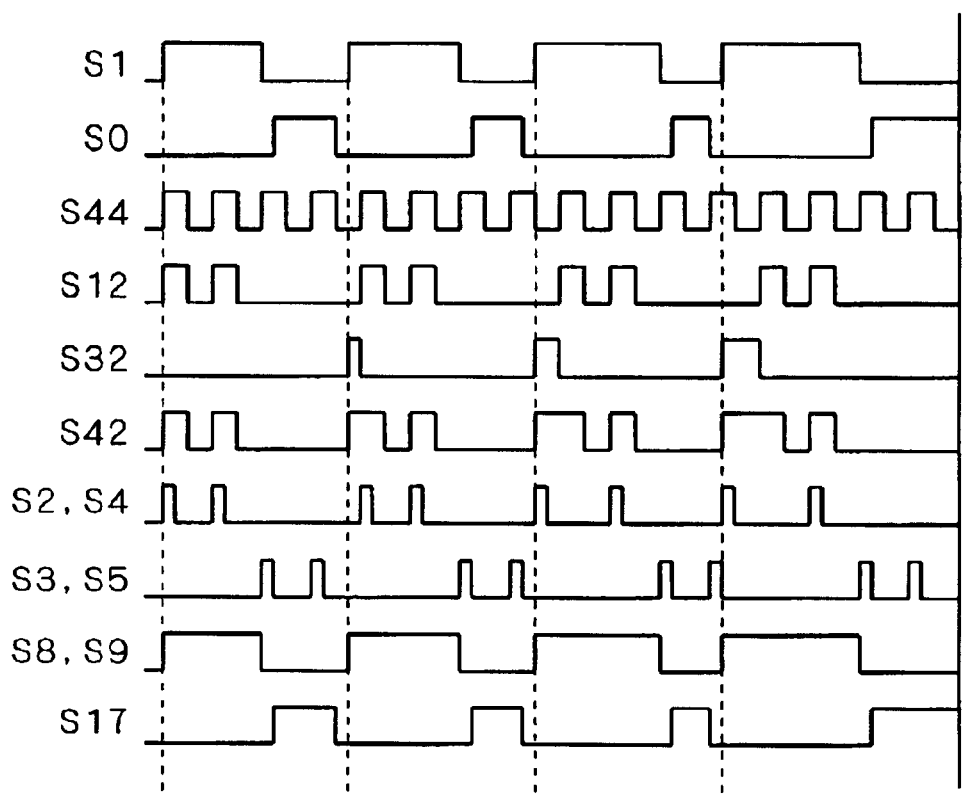

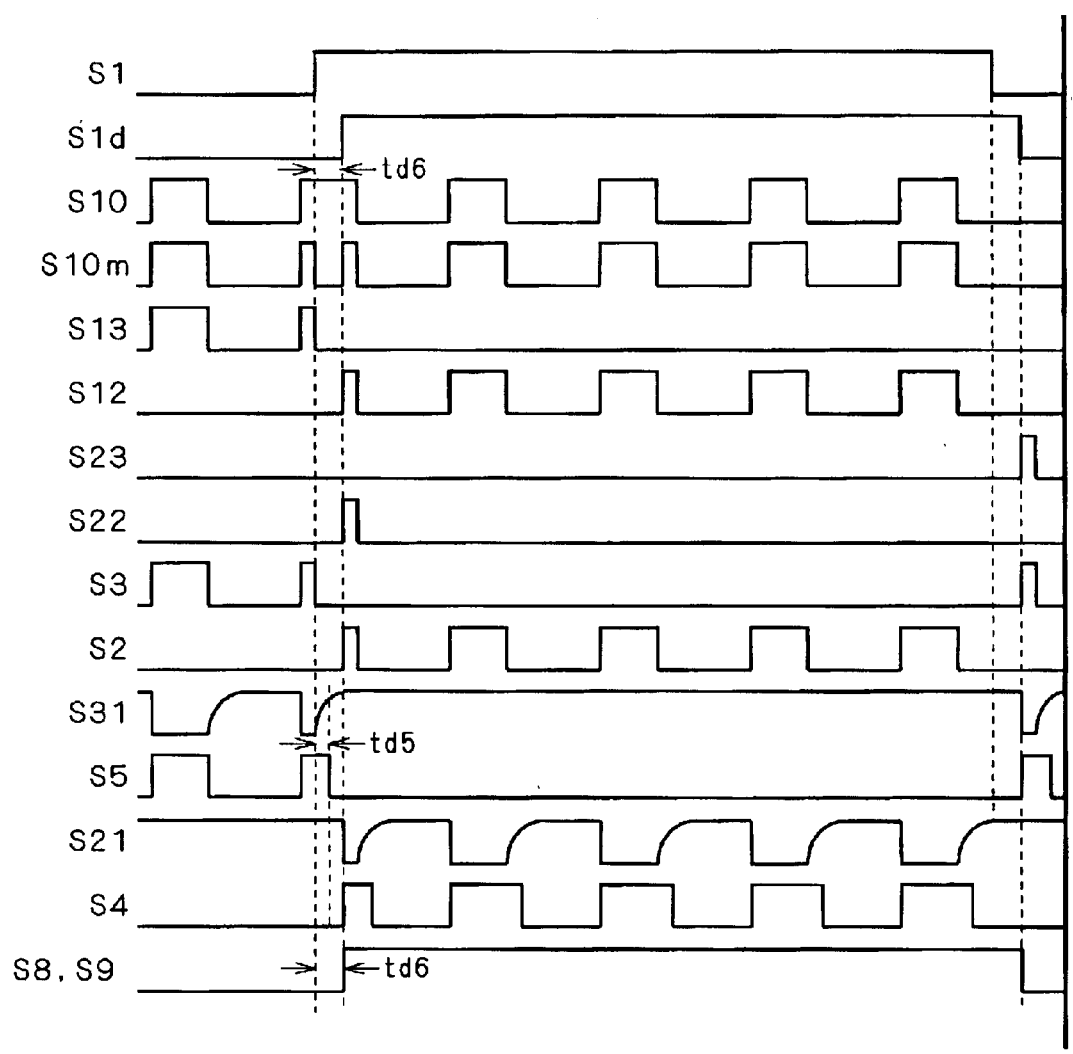
F I G. 26

F I G. 3 1
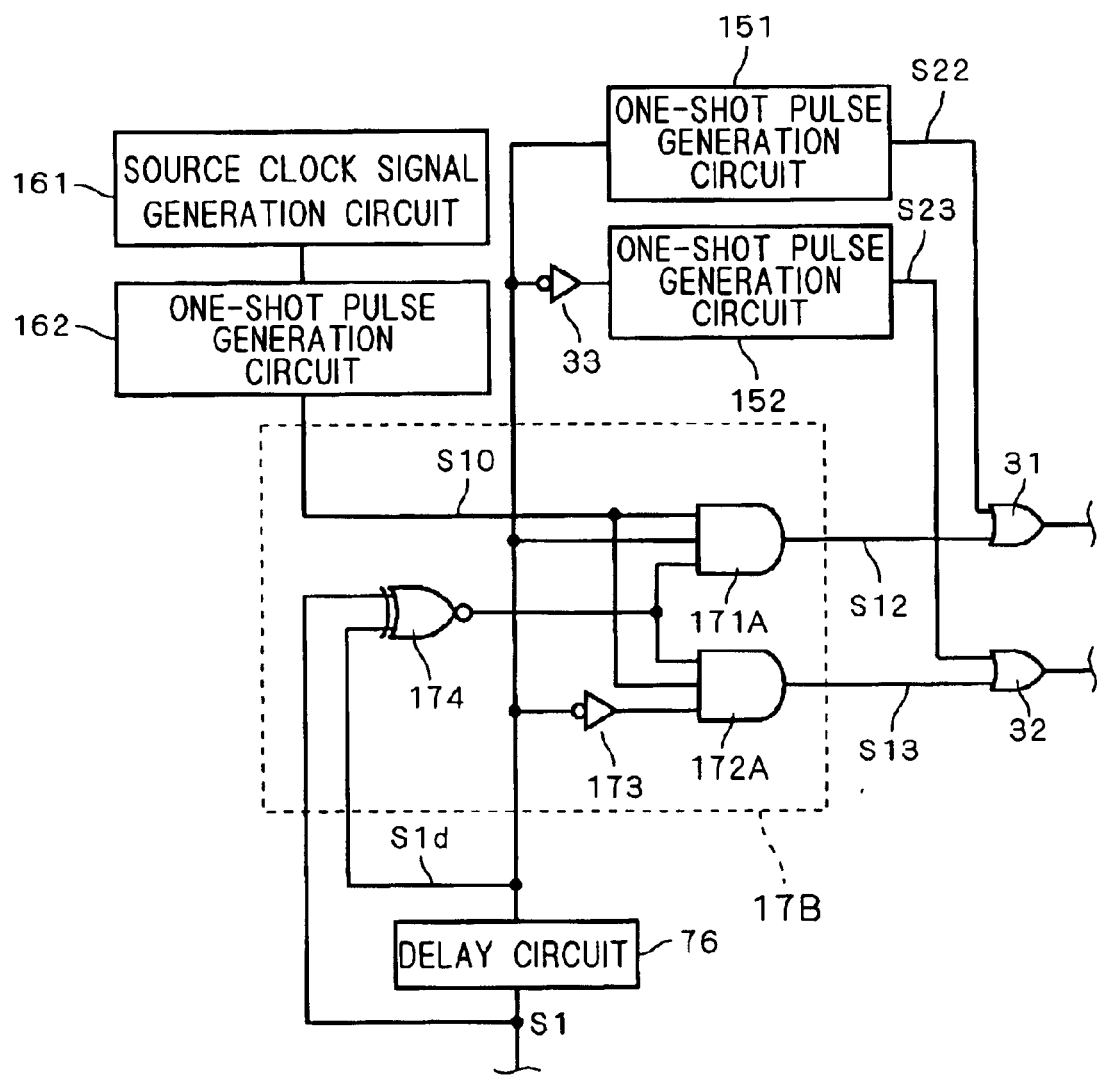

F I G. 34
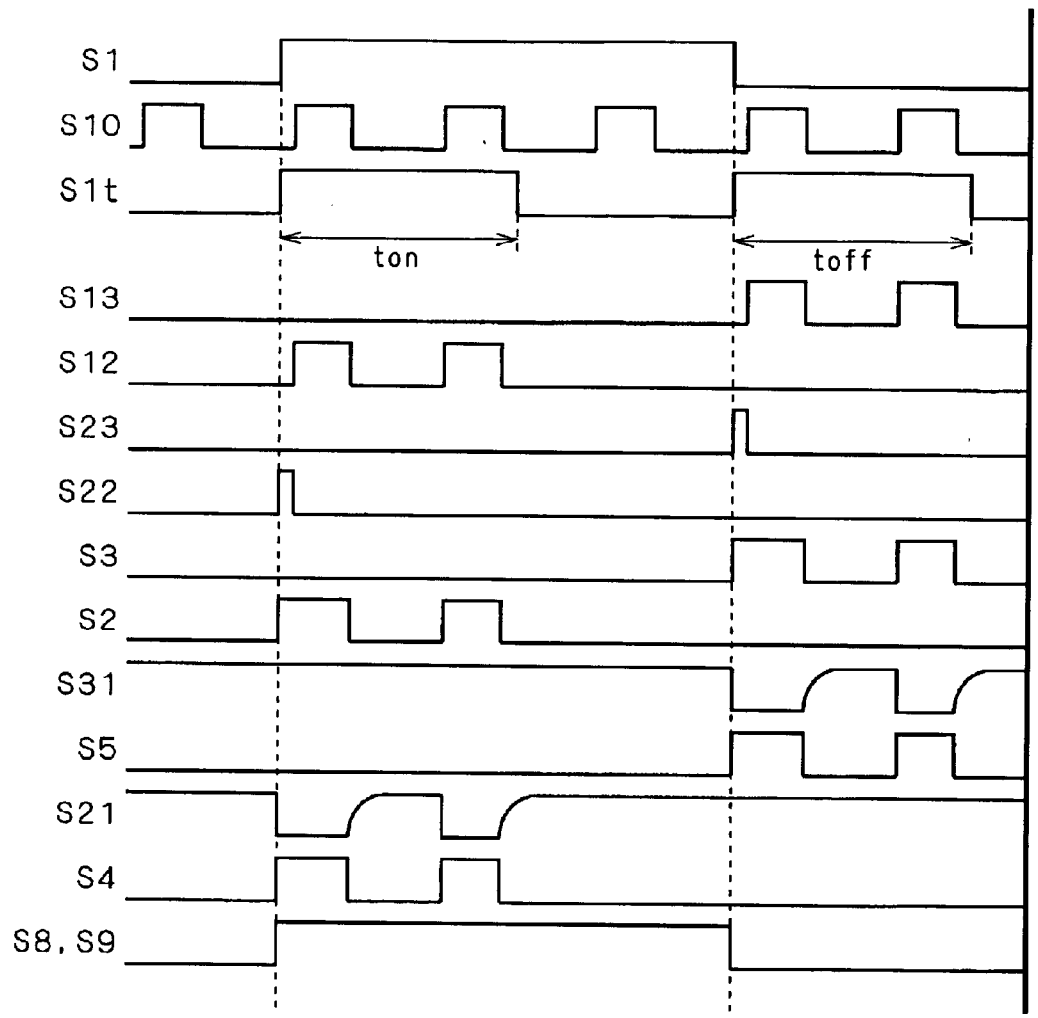
F I G. 35
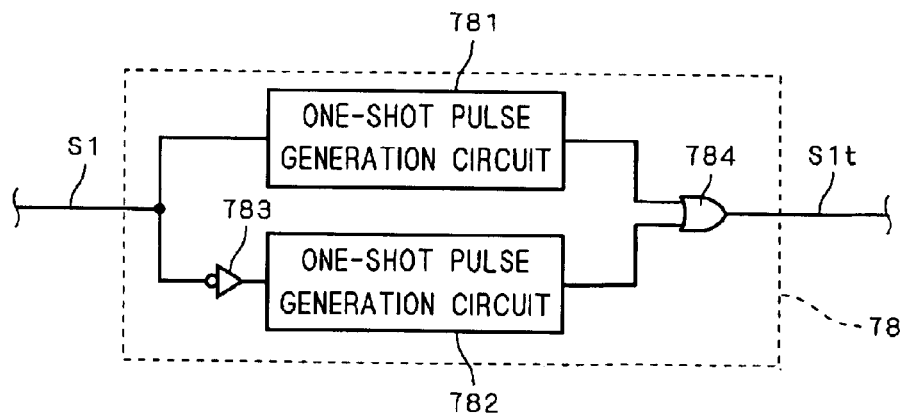

SEMICONDUCTOR DEVICE

BACKGROUND OF THE INVENTION

1. Field of the Invention

The present invention relates to a semiconductor device, and more particularly, it relates to a level shifting circuit for a power device preventing a malfunction resulting from a dv/dt transient signal.

2. Description of the Background Art

FIG. 36 shows the structure of a level shifting circuit 90 for a conventional power device. The structure shown in FIG. 36 is disclosed in Japanese Patent Laying-Open Gazette No. 9-200017 (1997).

Referring to FIG. 36, power devices 12 and 13 such as IGBTs (insulated gate bipolar transistors) are totem-pole-connected between a positive electrode and a negative electrode (ground potential GND) of a power source PS, to form a half-bridge power device. Freewheel diodes D1 and D2 are connected with the power devices 12 and 13 respectively in an antiparallel manner. A load (an inductive load such as a motor) 14 is connected to a node N1 between the power devices 12 and 13.

Referring to FIG. 36, the power device 12, switching between a reference potential defined by the potential of the node N1 between the power devices 12 and 13 and a power supply potential supplied by the power source PS, is referred to as a high-potential side power device.

The power device 13, switching between a reference potential defined by the ground potential and the potential of the node N1, is referred to as a low-potential side power device.

Therefore, the level shifting circuit 90 shown in FIG. 36 is divided into a high-potential side power device driving circuit HD and a low-potential side power device driving circuit LD.

The high-potential side power device driving circuit HD has NMOS transistors 24 and 25 serially connected between a positive electrode and a negative electrode of a high-potential side power source 10 for the driving circuit HD, and switches the power device 12 by complementarily turning on/off the NMOS transistors 24 and 25. The negative electrode of the high-potential side power source 10 is connected to the node N1. The voltage of the node between the NMOS transistors 24 and 25 is referred to as a high-potential side output voltage HO.

The high-potential side power device driving circuit HD has a pulse generation circuit 3 generating pulsing ON and OFF signals in response to positive level transition and negative level transition of a pulsing input signal S1, supplied from an externally provided microcomputer or the like, generated with reference to the ground potential for driving the NMOS transistors 24 and 25.

Two outputs of the pulse generation circuit 3 are connected to the gate electrodes of high withstand voltage N-channel field-effect transistors (hereinafter referred to as HNMOS transistors) 4 and 5 which are level shifting transistors. The ON and OFF signals are supplied to the gate electrodes of the HNMOS transistors 4 and 5 respectively.

The drain electrodes of the HNMOS transistors 4 and 5 are connected to first ends of resistors 29 and 30 as well as to inputs of inverter circuits 6 and 7 respectively.

Outputs of the inverter circuits 6 and 7 are connected to an input of a protective circuit 8 having an output connected to set and reset inputs of an SR flip-flop circuit 9. The protective circuit 8, serving as a filter circuit for preventing the SR flip-flop circuit 9 from a malfunction, is formed by a logic gate. The protective circuit 8 may also be referred to as a filter circuit 8.

A Q output of the SR flip-flop circuit 9 is connected to the gate electrode of the NMOS transistor 24 as well as to an input of an inverter circuit 23 having an output connected to the gate electrode of the NMOS transistor 25.

Second ends of the resistors 29 and 30 are connected to the drain electrode of the NMOS transistor 24, i.e., the positive electrode (the voltage thereof is referred to as a high-potential side floating power supply absolute voltage VB) of the high-potential side power source 10. The source electrode of the NMOS transistor 24, i.e., the negative electrode (the voltage thereof is referred to as a high-potential side floating power supply offset voltage VS) of the high-potential side power source 10 is connected to anodes of diodes 21 and 22 having cathodes connected to the drain electrodes of the HNMOS transistors 4 and 5 respectively.

The low-potential side power device driving circuit LD has NMOS transistors 27 and 28 serially connected between a positive electrode (the voltage thereof is referred to as a low potential side fixed power supply voltage VCC) and a negative electrode (ground potential) of a low-potential side power source 11 for the driving circuit LD, and switches the power device 13 by complementarily turning on/off the NMOS transistors 27 and 28. The voltage of the node between the NMOS transistors 27 and 28 is referred to as a low potential side output voltage LO, whose change defines a control signal S7 for controlling the power device 13. The NMOS transistor 27 is controlled by an externally supplied input signal S0, while the NMOS transistor 28 is controlled by a signal obtained by inverting the input signal S0 by an inverter circuit 26.

Operations of the level shifting circuit 90 are now described with reference to a timing chart shown in FIG. 37.

Referring to FIG. 37, the pulse generation circuit 3 successively generates pulses as ON and OFF signals S2 and S3 respectively in response to positive level transition and negative level transition of the externally supplied pulsing input signal S1.

First, a pulse signal making transition to a high potential is supplied as the OFF signal S3. At this time, the OFF signal S3 is at a low potential, and the HNMOS transistor 4 is turned on by the ON signal S2. The HNMOS transistor 5 is in an OFF state.

Thus, the resistor 29 connected to the HNMOS transistor 4 causes a voltage drop, for inputting a low-level signal in the inverter circuit 6. On the other hand, the resistor 30 connected to the HNMOS transistor 5 causes no voltage drop, for continuously inputting a high-level signal in the inverter circuit 7. Thus, the inverter circuit 6 outputs a pulse signal S4 making transition to a high level, while the inverter 7 outputs a signal S5 remaining low.

The protective circuit 8 receiving the output signals S4 and S5 from the inverter circuits 6 and 7 outputs a pulse signal S6 and a low-level signal S7 in correspondence to the output signals S4 and S5 from the inverter circuits 6 and 7 respectively.

Also when a pulse signal making transition to a high potential is supplied as the OFF signal S3, the level shifting circuit 90 performs operations similar to the above so that the protective circuit 8 outputs a pulse signal S7 and a low-level signal S6 in correspondence to the output signals S5 and S4 from the inverter circuits 7 and 6 respectively.

Consequently, an output signal S8 from the SR flip-flop circuit 9 goes high at a timing supplied with the ON signal S2 and goes low at a timing supplied with the OFF signal S3. A similar control signal S9 for the power device 12 is obtained by complementarily turning on/off the NMOS transistors 24 and 25.

Depending on the switching state of the half-bridge power device formed by the power devices 12 and 13, a dv/dt transient signal is disadvantageously generated in a line connecting the node N1 and the anodes of the diodes 21 and 22.

When the dv/dt transient signal is generated, a dv/dt current obtained by integrating drain-to-source parasitic electrostatic capacitances of the HNMOS transistors 4 and 5 and the dv/dt transient signal simultaneously flows to the HNMOS transistors 4 and 5.

Thus, it follows that error pulses P1 and P2 resulting from the dv/dt transient signal are simultaneously supplied as the signals S2 and S3 in place of the ON and OFF signals, while the protective circuit 8 is formed to prevent the SR flip-flop circuit 9 from such simultaneous signal inputs.

However, while the protective circuit 8 functions as a filter when the error pulses P1 ad P2 resulting from the dv/dt transient signal are simultaneously supplied as the signals S2 and S3, pulse signals P11 and P12 having widths responsive to time difference are supplied to the output signals S6 and S7 of the protective circuit 8 when the error pulses P1 and P2 resulting from the dv/dt transient signal are supplied with slight time difference due to dispersion of the element characteristics of the HNMOS transistors 4 and 5, leading to a malfunction bringing the power device 12 into an ON or OFF state by the pulse signals P11 and P12.

This malfunction of the power device 12 is maintained until a normal ON or OFF signal is subsequently supplied, and the power devices 12 and 13 may be shorted to cause inconvenience as the case may be.

SUMMARY OF THE INVENTION

An object of the present invention is to provide a level shifting circuit capable of preventing a power device from a malfunction even if a dv/dt transient signal is supplied with time difference.

According to a first aspect, a semiconductor device driving/controlling first and second switching devices serially connected with each other and interposed between a high main power supply potential and a low main power supply potential includes a control part, a pulse generation part and a level shifting part.

That is, the control part controls conduction/non-conduction of a high-potential side switching device of either the first or second switching device.

The pulse generation part generates first and second iterative pulse signals in correspondence to first and second states of a first input signal having the first state indicating conduction of the high-potential side switching device and the second state indicating non-conduction of the high-potential side switching device.

The level shifting part level-shifts the first and second iterative pulse signals to a higher potential side for obtaining first and second level-shifted iterative pulse signals respectively, and the control part outputs a control signal rendering the high-potential side switching device conductive or non-conductive on the basis of the first and second level-shifted iterative pulse signals.

The first and second iterative pulse signals having pulses of a constant cycle are supplied as ON and OFF signals in correspondence to the first input signal so that first and second level shifting semiconductor elements are cyclically turned on for level-shifting the ON and OFF signals to high-potential sides and converting the same to the first and second level-shifted iterative pulse signals. Even if an error pulse resulting from a dv/dt transient signal is supplied to the first and second iterative pulse signals for setting the control part, therefore, this period sustains only until a normal pulse is supplied as the OFF signal. Therefore, a period when both of the first and second switching devices are in ON states is limited to that corresponding to the cycle of the first and second iterative pulse signals at the maximum followed by normal control, whereby the first and second switching devices can be prevented from being simultaneously turned on and inconveniently shorted.

In the semiconductor device, the pulse generation part preferably includes a clock signal generation part generating a clock signal, an iterative pulse generation part, a first one-shot pulse generation circuit, a second one-shot pulse generation circuit, a first logic circuit and a second logic circuit.

That is, the iterative pulse generation part receives the clock signal and the first input signal and outputs the clock signal as a first signal only in a period when the first input signal is in the first state while outputting the clock signal as a second signal only in a period when the first input signal is in the second state.

The first one-shot pulse generation circuit receives the first input signal and outputs a third signal having a pulse synchronized with transition of the first input signal to the first state in each cycle of the first input signal.

The second one-shot pulse generation circuit receives an inverted signal of the first input signal and outputs a fourth signal having a pulse synchronized with transition of the first input signal to the second state in each cycle of the first input signal.

The first logic circuit receives the first and third signals, operates the OR of the signals and outputs the same as the first iterative pulse signal.

The second logic circuit receives the second and fourth signals, operates the OR of the signals and outputs the same as the second iterative signal.

The semiconductor device uses the signals obtained by operating the ORs of the respective ones of the first and second signals output from the iterative pulse generation part and the third and fourth signals output from the first and second one-shot pulse generation circuits as the first and second iterative pulse signals, whereby the first and second iterative pulse signals are synchronized with the first input signal so that a time delay resulting from signal displacement can be eliminated between the first input signal and a control signal for the high-potential side switching device, i.e., between an input and an output, for preventing the high-potential side switching device from reduction in response speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a timing chart illustrating operations of the semiconductor device according to the embodiment 4 of the present invention;

FIG. 20 is a timing chart illustrating operations of the semiconductor device according to the embodiment 8 of the present invention;

FIGS. 26 and 27 are timing charts illustrating operations of the semiconductor device according to the embodiment 9 of the present invention;

FIG. 31 illustrates the structure of another modification of the semiconductor device according to the embodiment 9 of the present invention;

FIGS. 33 and 34 are timing charts illustrating operations of the semiconductor device according to the embodiment 10 of the present invention;

FIG. 35 illustrates the structure of a timer circuit;

DESCRIPTION OF THE PREFERRED EMBODIMENTS

<A. Embodiment 1>

<A-1. Device Structure>

Figure 1:
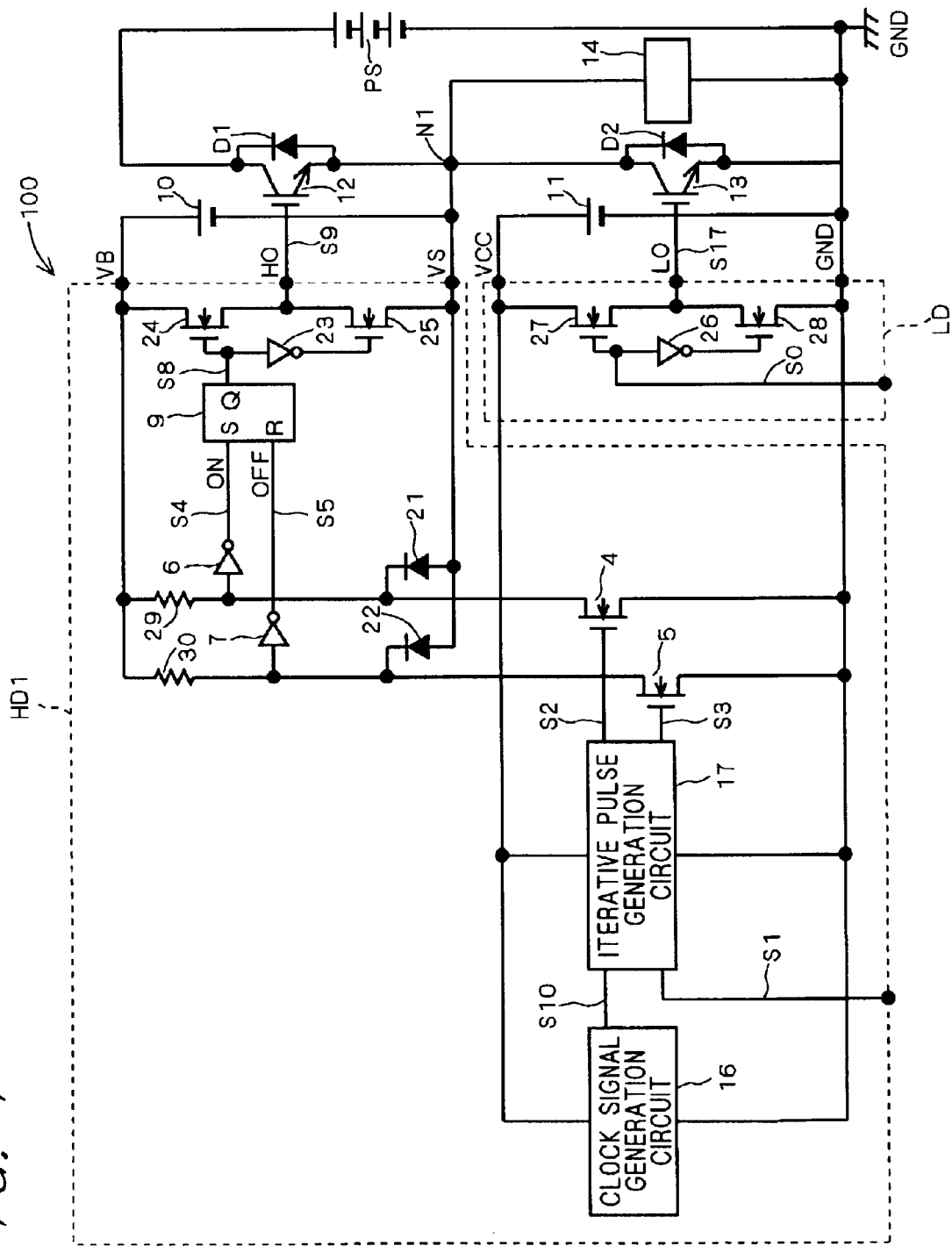
FIG. 1 illustrates the structure of a semiconductor device according to an embodiment 1 of the present invention.

FIG. 1 shows the structure of a status system level shifting circuit 100 as a semiconductor device according to an embodiment 1 of the present invention.

Referring to FIG. 1, power devices 12 and 13 such as IGBTs (insulated gate bipolar transistors) are totem-pole-connected between a positive electrode and a negative electrode (ground potential GND) of a power source PS, to form a half-bridge power device. Freewheel diodes D1 and D2 are connected with the power devices 12 and 13 respectively in an antiparallel manner. A load (inductive load such as a motor) 14 is connected to a node N1 between the power devices 12 and 13.

Referring to FIG. 1, the power device 12, switching between a reference potential defined by the potential of the node N1 between the power devices 12 and 13 and a power supply potential supplied by the power source PS, is referred to as a high-potential side power device.

The power device 13, switching between a reference potential defined by the ground potential and the potential of the node N1, is referred to as a low-potential side power device.

The level shifting circuit 100 driving/controlling the half-bridge power device is divided into a high-potential side power device driving circuit HD1 and a low-potential side power device driving circuit LD.

The high-potential side power device driving circuit HD1 has NMOS transistors 24 and 25 serially connected between a positive electrode and a negative electrode of a high-potential side power source 10 for the driving circuit HD1, and switches the power device 12 by complementarily turning on/off the NMOS transistors 24 and 25. The negative electrode of the high-potential side power source 10 is connected to the node N1. The voltage of the node between the NMOS transistors 24 and 25 is referred to as a high-potential side output voltage HO.

The high-potential side power device driving circuit HD1 further has a clock signal generation circuit 16 outputting pulses in a constant cycle T thereby generating the so-called internal clock signal for driving the NMOS transistors 24 and 25 and an iterative pulse generation circuit 17 monitoring the state of an external input signal (first input signal) S1 in synchronization with an output signal S10 from he clock signal generation circuit 16, receiving the pulsing input signal S1 (having two potential states, i.e., first and second states) generated with reference to the ground potential and generating pulsing ON and OFF signals (first and second iterative pulse signals) S2 and S3.

The combination of the clock signal generation circuit 16 and the iterative pulse generation circuit 17 can be referred to as a pulse generation part, which is supplied with driving power from a low-potential side power source 11 for the low-potential source power device driving circuit LD.

Figure 2:
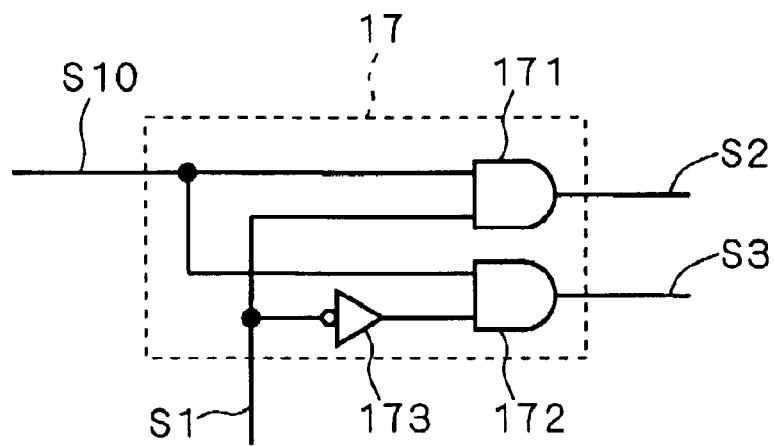
FIG. 2 illustrates an exemplary structure of an iterative pulse generation circuit.

An exemplary structure of the iterative pulse generation circuit 17 is now described with reference to FIG. 2. As shown in FIG. 2, the iterative pulse generation circuit 17 has two two-input AND circuits 171 and 172. The output signal S10 from the clock signal generation circuit 16 is input in the AND circuits 171 and 172, while the external input signal S1 is input in the AND circuit 171 and in the AND circuit 172 through an inverter circuit 173. The AND circuits 171 and 172 output the ON and OFF signals S2 and S3 respectively.

According to this structure, a clock signal can be output as the ON signal S2 when the input signal S1 is at a high potential, i.e., in an ON period, and can be output as the OFF signal S3 when the input signal S1 is at a low potential, i.e., in an OFF period.

Referring again to FIG. 1, two outputs of the iterative pulse generation circuit 17 are connected to the gate electrodes of high withstand voltage N-channel field-effect transistors (hereinafter referred to as HNMOS transistors) 4 and 5 which are level shifting transistors. The ON and OFF signals S2 and S3 are supplied to the gate electrodes of the HNMOS transistors 4 and 5 respectively.

The drain electrodes of the HNMOS transistors 4 and 5 are connected to first ends of resistors 29 and 30 as well as to inputs of inverter circuits 6 and 7 respectively.

Outputs of the inverter circuits 6 and 7 are connected to set and reset inputs of an SR flip-flop circuit 9.

A Q output of the SR flip-flop circuit 9 is connected to the gate electrode of an NMOS transistor 24 as well as to an input of an inverter circuit 23, having an output connected to the gate electrode of an NMOS transistor 25.

Second ends of the resistors 29 and 30 are connected to the drain electrode of the NMOS transistor 24, i.e., the positive electrode (the voltage thereof is referred to as a high-potential side floating power supply absolute voltage VB) of the high-potential side power source 10. The source electrode of the NMOS transistor 24, i.e., the negative electrode (the voltage thereof is referred to as a high-potential side floating power supply offset voltage VS) of the high-potential side power source 10 is connected to anodes of diodes 21 and 22, having cathodes connected to the drain electrodes of the HNMOS transistors 4 and 5 respectively.

The low-potential side power device driving circuit LD has NMOS transistors 27 and 28 serially connected between a positive electrode (the voltage thereof is referred to as a low-potential side fixed power supply voltage VCC) and a negative electrode (ground potential) of a low-potential side power source 11 for the driving circuit LD, and switches the power device 13 by complementarily turning on/off the NMOS transistors 27 and 28.

The voltage of the node between the NMOS transistors 27 and 28 is referred to as a low-potential side output voltage LO, whose change defines a control signal S17 controlling the power device 13.

The NMOS transistor 27 is controlled by an externally supplied input signal S0 (second input signal), and the NMOS transistor 28 is controlled by a signal obtained by inverting the input signal S0 by an inverter circuit 26.

<A-2. Device Structure>

Operations of the level shifting circuit 100 are now described with reference to a timing chart shown in FIG. 3.

Figure 3:
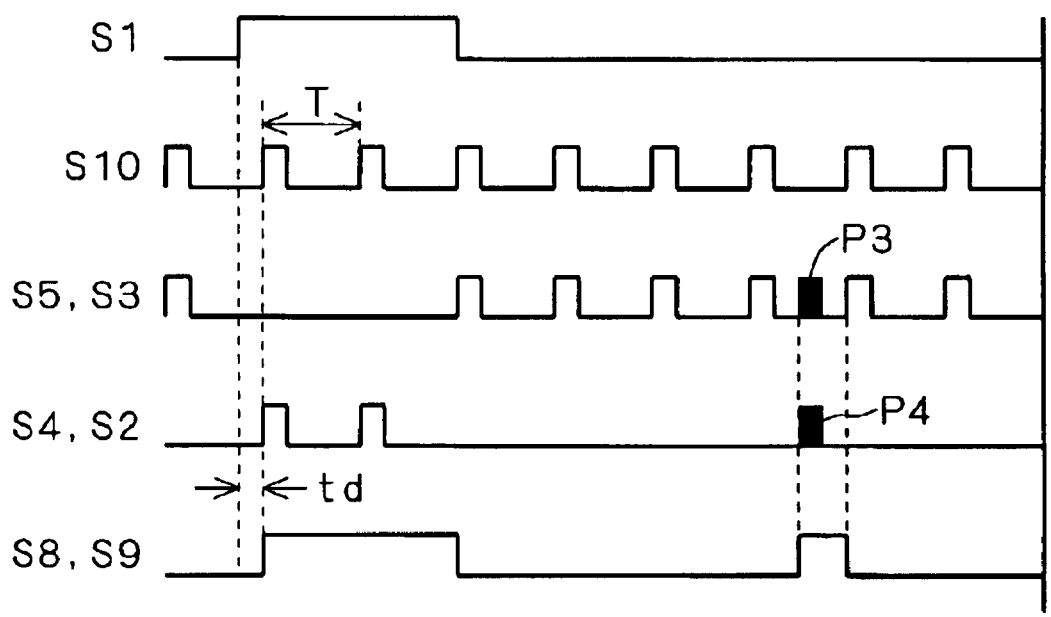
FIG. 3 is a timing chart illustrating operations of the semiconductor device according to the embodiment 1 of the present invention.

Referring to FIG. 3, the iterative pulse generation circuit 17 receiving the externally supplied pulsing input signal S1 iteratively outputs a pulse synchronized with that of the output signal S10 as the ON signal S2 at a timing when the pulse of the output signal S10 from the clock signal generation circuit 16 goes high (rises). This operation is maintained until the input signal S1 goes low (falls).

The iterative pulse generation circuit 17 receiving the pulsing input signal S1 stops outputting a pulse synchronized with the pulse of the output signal S10 as the OFF signal S3 in a period when the input signal S1 remains high, while outputting the pulse synchronized with that of the output signal S10 as the OFF signal S3 after the input signal S1 falls. This operation is maintained in a period when the input signal S1 is low.

The HNMOS transistor 4 is cyclically turned on by the pulse of the ON signal S2. The HNMOS transistor 5 remains off while the pulse is output as the ON signal S2.

When the HNMOS transistor 4 is turned on, the resistor 29 connected to the HNMOS transistor 4 causes a voltage drop to input a low-level signal in the inverter circuit 6. On the other hand, the resistor 30 connected to the HNMOS transistor 5 causes no voltage drop, and hence a high-level signal is continuously input in the inverter circuit 7. Therefore, the inverter circuit 6 outputs a pulse signal as an output signal S4, while an output signal S5 of the inverter circuit 7 remains low.

The SR flip-flop circuit 9 of an inversion input type is set when high- and low-level signals are supplied to the set and reset inputs respectively, to output a high-level signal from the Q output. Therefore, the SR flip-flop circuit 9 receiving the output signals S4 and S5 from the inverter circuits 6 and 7 is set at a timing when the first pulse of the output signal S4 goes high (rises), and the output signal S8 from the Q output thereof remains high. This state is maintained in a period when the pulse is iteratively output as the output signal S4, and reset at a timing when the first pulse of the output signal S5 goes high (rises).

A similar control signal S9 for the power device 12 is obtained by complementarily turning on/off the NMOS transistors 24 and 25 by the output signals S4 and S5.

In a period when the input signal S1 is low, a pulse synchronized with that of the output signal S10 is iteratively output as the OFF signal S3, for cyclically turning on the HNMOS transistor 5.

When the HNMOS transistor 5 is turned on, the resistor 30 connected to the HNMOS transistor 5 causes a voltage drop to input a low-level signal in the inverter circuit 7. On the other hand, the resistor 29 connected to the HNMOS transistor 4 causes no voltage drop, and hence a high-level signal is continuously input in the inverter circuit 6. Therefore, the inverter circuit 7 iteratively outputs a pulse as the output signal S5, while the output signal S4 from the inverter circuit 6 remains low.

The SR flip-flop circuit 9 receiving the output signals 4 and S5 from the inverter circuits 6 and 7 are reset at a timing when the first pulse of the output signal S5 rises, and the output signal S8 from the Q output thereof remains low. This state is maintained in a period when the pulse is iteratively output as the output signal S5.

<A-3. Function/Effect>

In the level shifting circuit 100 according to the embodiment 1 of the present invention, as hereinabove described, pulses are iteratively supplied to the ON and OFF signals S2 and S3 in the constant cycle T in correspondence to the external input signal S1 for cyclically turning on the HNMOS transistors 4 and 5, thereby level-shifting the ON and OFF signals S2 and S3 to the high-potential side for defining the signals S4 and S5 (level-shifted ON and OFF signals).

Also when the ON and OFF signals S2 and S3 are supplied with error pulses P3 and P4 resulting from a dv/dt transient signal and the error pulse P3 sets the SR flip-flop circuit 9 in the OFF period, therefore, this state sustains only until a normal pulse is supplied to the OFF signal S3. Therefore, the period when the power device 12 is in an ON state is limited to that corresponding to the cycle T at the maximum followed by normal control, whereby the power devices 12 and 13 can be prevented from being simultaneously turned on and inconveniently shorted.

The cycle T of the pulse generated by the clock signal generation circuit 16 is sufficiently reduced as compared with the cycle of the pulsing input signal S1, i.e., the frequency of the pulse is increased. For example, the power devices 12 and 13 can withstand a shorted state for about 1 $\mu$sec., and hence the clock signal generation circuit 16 may be so formed as to have an oscillation frequency of 1 to 2 MHz in consideration of a signal transmission time, in order to suppress the shorting time within 1 $\mu$sec.

<B. Embodiment 2>
<B-1. Device Structure>

Figure 4:
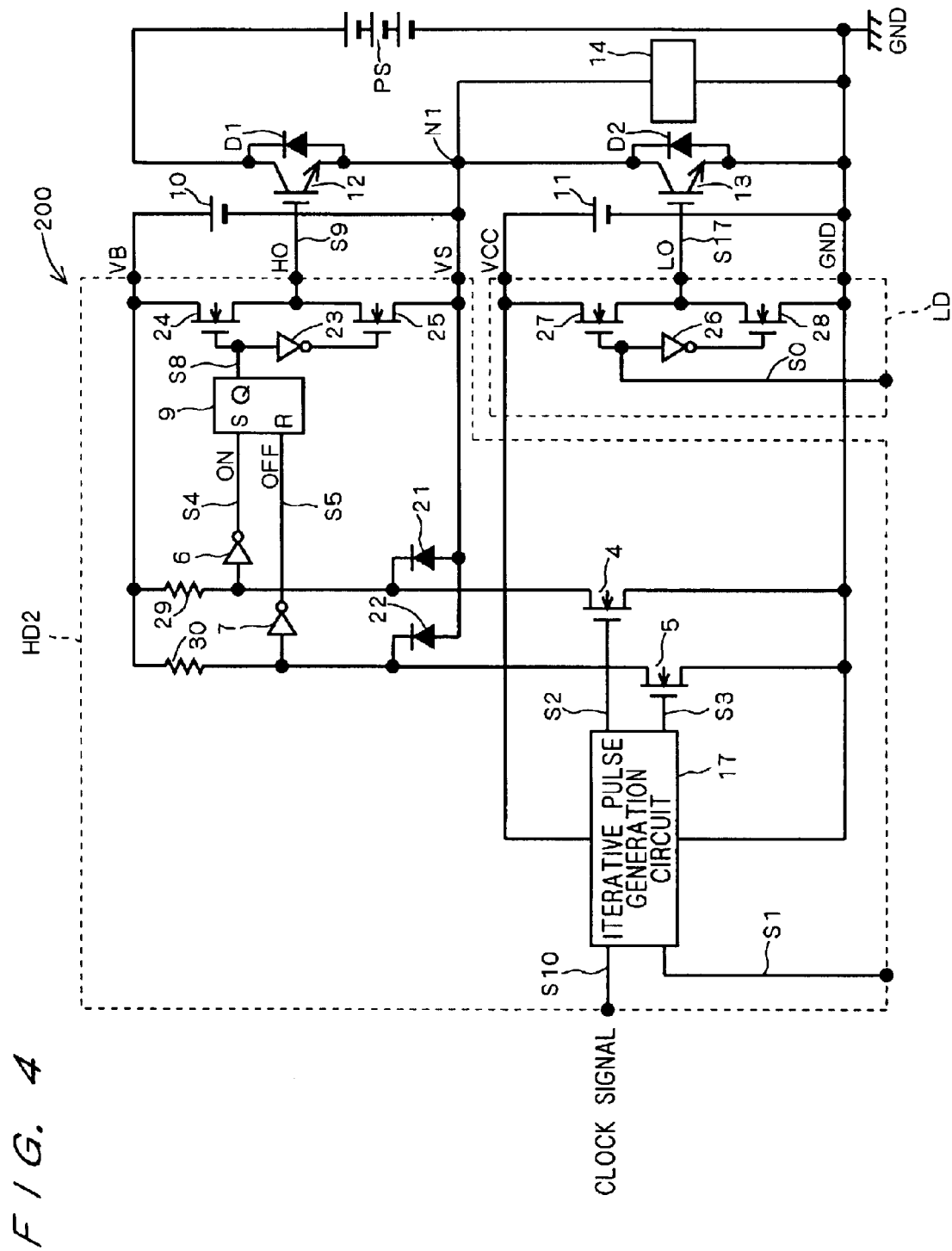
FIG. 4 illustrates the structure of a semiconductor device according to an embodiment 2 of the present invention.

FIG. 4 shows the structure of a level shifting circuit 200 as a semiconductor device according to an embodiment 2 of the present invention. Referring to FIG. 4, elements identical to those of the level shifting circuit 100 shown in FIG. 1 are denoted by the same reference numerals, to omit redundant description.

As shown in FIG. 4, the level shifting circuit 200 is divided into a high-potential side power device driving circuit HD2 and a low-potential side power device driving circuit LD. The high-potential side power device driving circuit HD2 has no clock signal generation circuit 16 corresponding to that provided in the level shifting circuit 100 shown in FIG. 100 but supplies an externally supplied clock signal to an iterative pulse generation circuit 17 as a signal S10.

While the level shifting circuit 100 shown in FIG. 1 employs the pulse signal generated by the clock signal generation circuit 16 originally provided therein, the timing of the pulse of the externally supplied input signal S1 may not match with the timing of the pulse supplied from the clock signal generation circuit 16 in this case, leading to a time delay td resulting from displacement of the clock signal between the input signal S1 and the control signal S9 for the power device 12 (see FIG. 3).

The problem of the time delay td can be solved by employing the externally supplied clock signal as in the embodiment 2.

<B-2. Device Operation>

Figure 5:
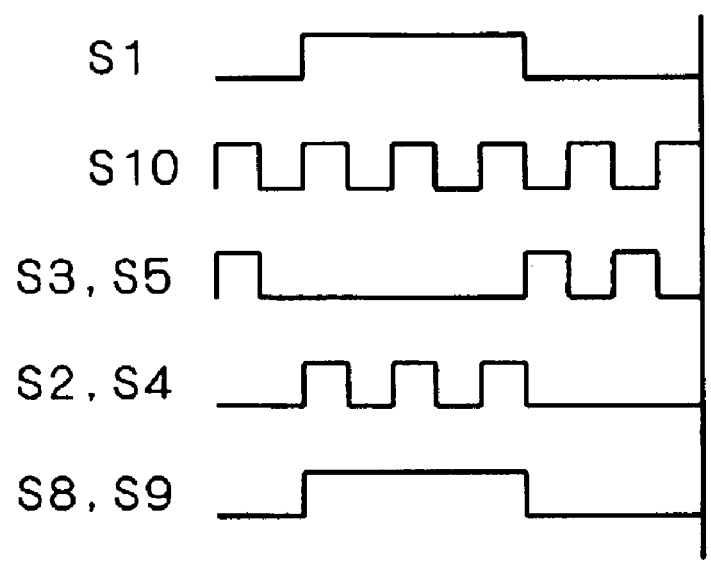
FIG. 5 is a timing chart illustrating operations of the semiconductor device according to the embodiment 2 of the present invention.

Characteristic operations of the level shifting circuit 200 are now described with reference to a timing chart shown in FIG. 5.

The iterative pulse generation circuit 17 receiving an externally supplied pulsing input signal S1 iteratively outputs a pulse synchronized with that of the external clock signal S10 as an ON signal S2 at a timing when the pulse of the externally supplied external clock signal S10 rises.

When a microcomputer or the like controls the device having a half-bridge power device including the level shifting circuit 200, a common clock signal (the external clock signal) is employed and hence the input signal S1 is also generated in synchronization with the external clock signal.

Therefore, the external clock signal S10 supplied to the iterative pulse generation circuit 17 is synchronous with the input signal S1 and the rise timing of the input signal S1 matches with the timing when the first pulse of the ON signal S2 is supplied, whereby no time delay results from displacement between these signals.

This also applies to a fall timing of the input signal S1 and a timing when a pulse of an OFF signal S3 is supplied.

<B-3. Function/Effect>

In the level shifting circuit 200 according to the embodiment 2 of the present invention, as hereinabove described, pulses are iteratively supplied to the ON and OFF signals S2 and S3 in a constant cycle in synchronization with the external input signal S1, whereby no time delay results from displacement of a clock signal between the input signal S1 and a control signal S9 for a power device 12, i.e., between an input and an output, and the power device 12 can be prevented from reduction in response speed.

<C. Embodiment 3>
<C-1. Device Structure>

Figure 6:
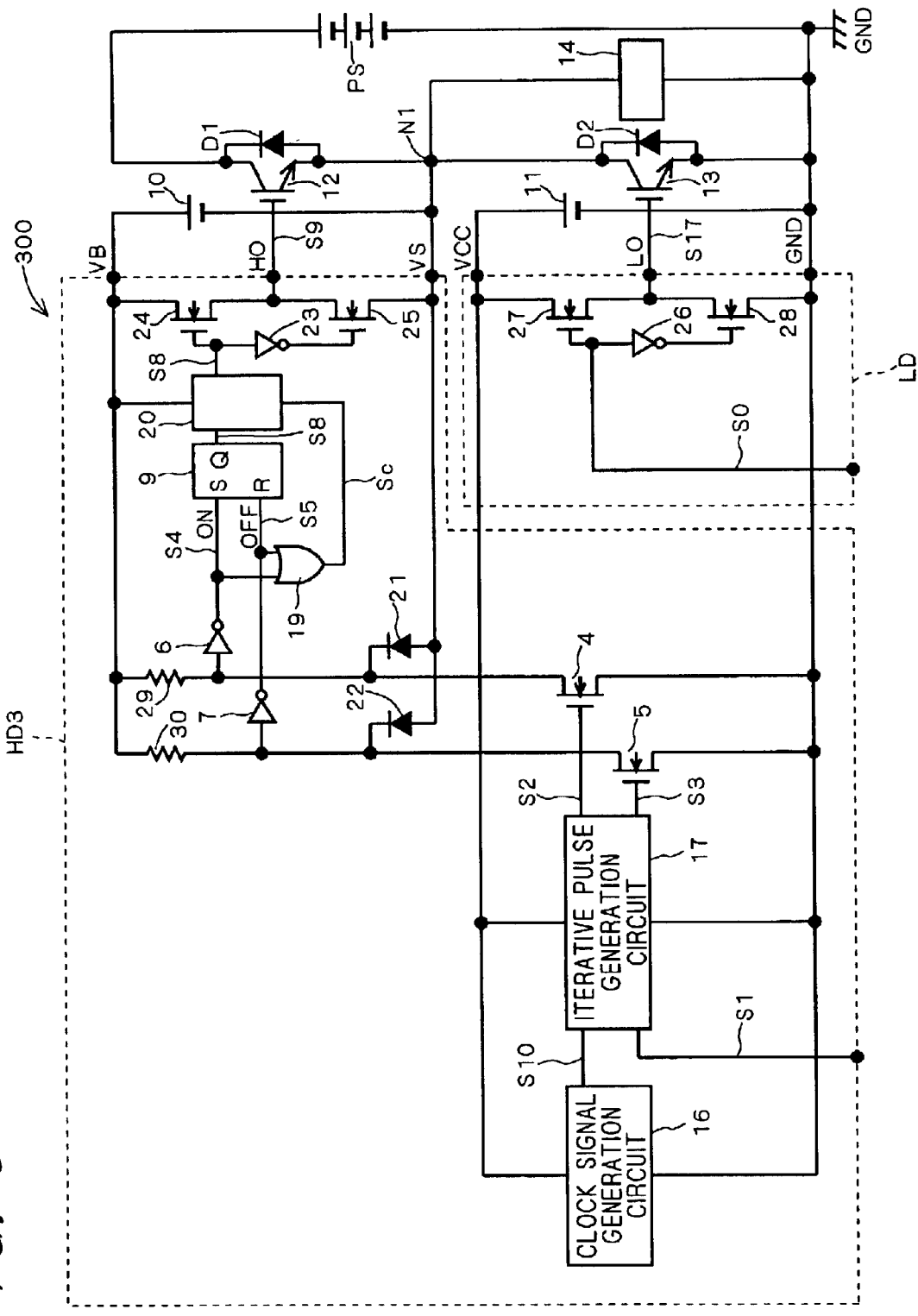
FIG. 6 illustrates the structure of a semiconductor device according to an embodiment 3 of the present invention.

FIG. 6 shows the structure of a level shifting circuit 300 as a semiconductor device according to an embodiment 3 of the present invention. Referring to FIG. 6, elements identical to those of the level shifting circuit 100 shown in FIG. 1 are denoted by the same reference numerals, to omit redundant description.

As shown in FIG. 6, the level shifting circuit 300 is divided into a high-potential side power device driving circuit HD3 and a low-potential side power device driving circuit LD. The high-potential side power device driving circuit HD3 has an OR circuit 19 operating the OR of iteratively supplied level-shifted ON an OFF signals S4 and S5 thereby obtaining a clock signal of the same frequency as the oscillation frequency of a clock signal generation circuit 16 in a high-potential region.

Outputs of inverter circuits 6 and 7 are connected to set and reset inputs of an SR flip-flop circuit 9 as well as to two inputs of the OR circuit 19.

An output signal Sc from the OR circuit 19 is supplied to a protective circuit 20 connected to a Q output of the SR flip-flop circuit 9.

The protective circuit 20 has a function of detecting an operation error of each structure of the high-potential region such as reduction of a power supply voltage of a high-potential side power source 10 and forcibly stopping an output regardless of an input state, and includes an output connected to the gate electrode of an NMOS transistor 24 and to an input of an inverter circuit 23.

Symbol S8 denotes an output signal of the protective circuit 20, which is substantially identical to an output signal S8 from the SR flip-flop circuit 9.

<C-2. Device Operation>

Characteristic operations of the level shifting circuit 300 are now described with reference to a timing chart shown in FIG. 7.

Figure 7:
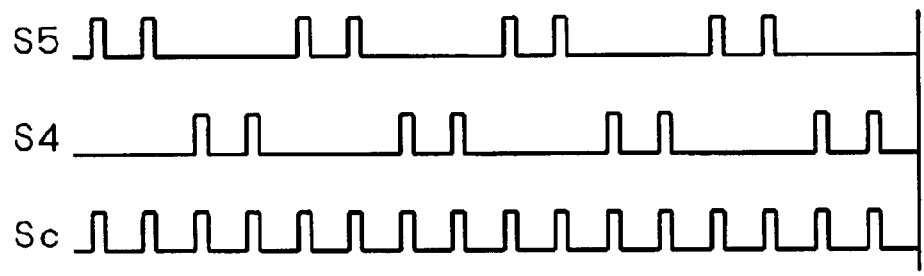
FIG. 7 is a timing chart illustrating operations of the semiconductor device according to the embodiment 3 of the present invention.

The timing chart of FIG. 7 illustrating operations of the OR circuit 19 indicates that the clock signal of the same frequency as the oscillation frequency of the clock signal generation circuit 16 can be obtained as the output signal Sc by operating the OR of the iteratively supplied level-shifted ON and OFF signals S4 and S5.

The protective circuit 20 supplied with the output signal Sc can perform correct operations.

When the protective circuit 20 has a filter circuit not recognizing an error unless an error operation sustains in excess of a prescribed time in a monitored element of the high-potential region, the error operation time can be measured on the basis of the output signal Sc, whereby measurement accuracy is improved to enable a correct protective operation.

<C-3. Function/Effect>

In the level shifting circuit 300 according to the embodiment 3 of the present invention, as hereinabove described, the clock signal of the same frequency as the oscillation frequency of the clock signal generation circuit 16 can be obtained in the high-potential region by operating the OR of the level-shifted ON and OFF signals S4 and S5 for supplying the clock signal to the protective circuit 20 thereby improving detection accuracy for an operation error of each element in the high-potential region and enabling a correct protective operation of the protective circuit 20.

The level-shifting circuit 200 shown in FIG. 4 may be provided with the OR circuit 19 and the protective circuit 20, as a matter of course. In this case, a clock signal identical to the external clock signal S10 can be obtained in the high-potential region.

<D. Embodiment 4>

<D-1. Device Structure>

Figure 8:
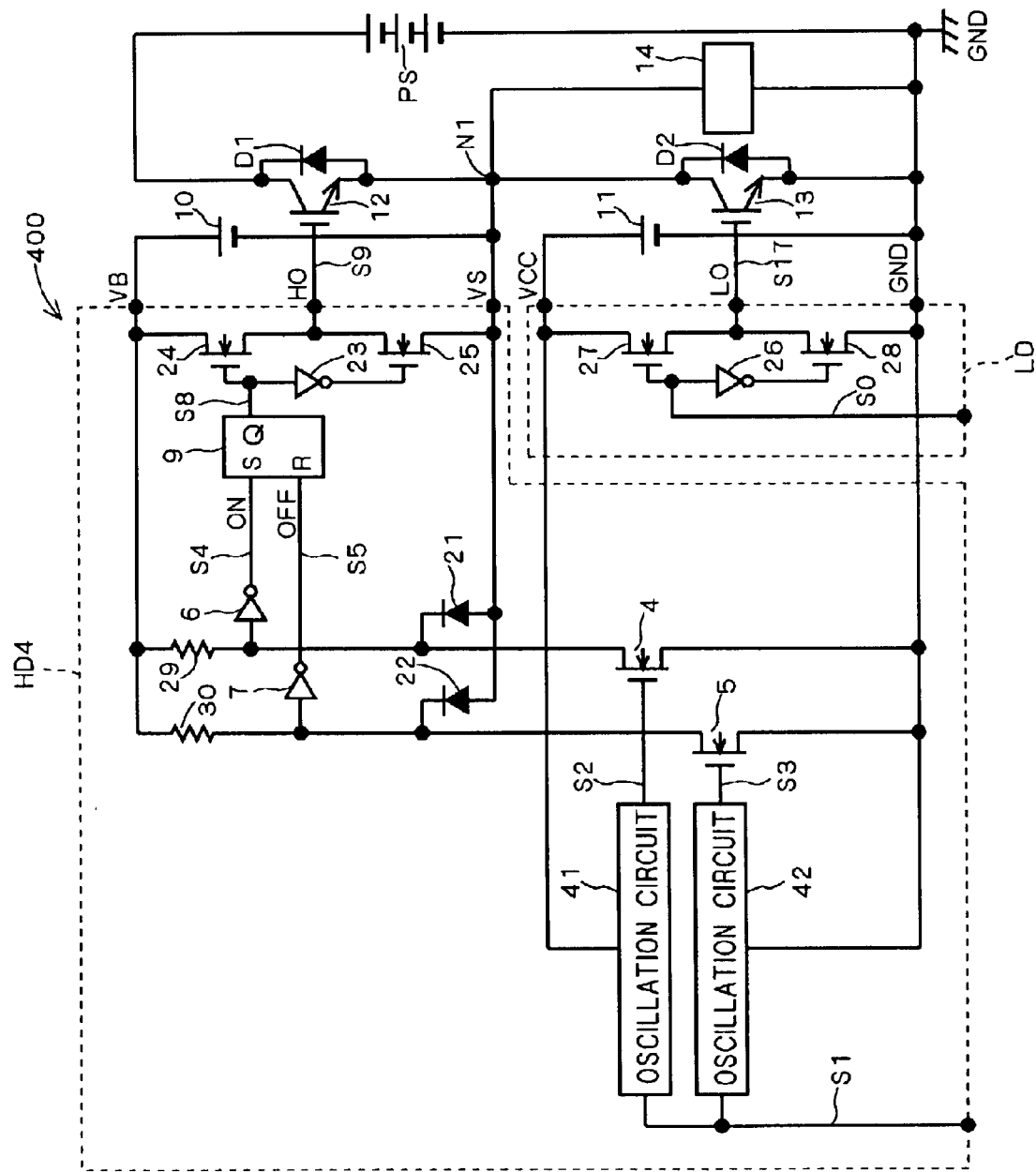
FIG. 8 illustrates the structure of a semiconductor device according to an embodiment 4 of the present invention.

FIG. 8 shows the structure of a level shifting circuit 400 as a semiconductor device according to an embodiment 4 of the present invention. Referring to FIG. 8, elements identical to those of the level shifting circuit 100 shown in FIG. 1 are denoted by the same reference numerals, to omit redundant description.

As shown in FIG. 8, the level shifting circuit 400 is divided into a high-potential side power device driving circuit HD4 and a low-potential side power device driving circuit LD. The high-potential side power device driving circuit HD4 has no clock signal generation circuit 16 and iterative pulse generation circuit 17 corresponding to those provided in the level shifting circuit 100 shown in FIG. 1 but substitutionally includes an oscillation circuit 41 receiving an external input signal S1 and iteratively outputting a pulse of a constant cycle as an ON signal S2 in synchronization with transition (rising) of the input signal S1 to a high level and an oscillation circuit 42 iteratively outputting a pulse of a constant cycle as an OFF signal S3 in synchronization with the trailing edge of the input signal S1.

<D-2. Device Operation>

Characteristic operations of the level shifting circuit 400 are now described with reference to a timing chart shown in FIG. 9.

As shown in FIG. 9, the oscillation circuit 41 receiving the externally supplied pulsing input signal S1 starts iteratively outputting a pulse in a constant cycle on the leading edge of the input signal S1 and stops outputting the pulse on the trailing edge of the input signal S1. Therefore, the rise timing of the input signal S1 matches with a timing when the first pulse of the ON signal S2 is supplied, whereby no time delay results from displacement between the signals S1 and S2.

On the other hand, the oscillation circuit 42 receiving the externally supplied pulsing input signal S1 stops iteratively outputting a pulse in a constant cycle in a period when the input signal remains high, and starts outputting the pulse after the input signal S1 goes low. Therefore, the fall timing of the input signal S1 matches with the timing when the first pulse of the OFF signal S3 is supplied, whereby no time delay results from displacement between the signals S1 and S3.

<D-3. Function/Effect>

As hereinabove described, the level shifting circuit 400 according to the embodiment 4 of the present invention comprises the oscillation circuits 41 and 42 iteratively outputting the pulses of constant cycles in synchronization with the input signal S1 as the ON and OFF signals S2 and S3, whereby no time delay results from displacement of a clock signal between the input signal S1 and a control signal S9 for a power device 12, i.e., between an input and an output, and the power device 12 can be prevented from reduction in response speed.

<E. Embodiment 5>

<E-1. Device Structure>

Figure 10:
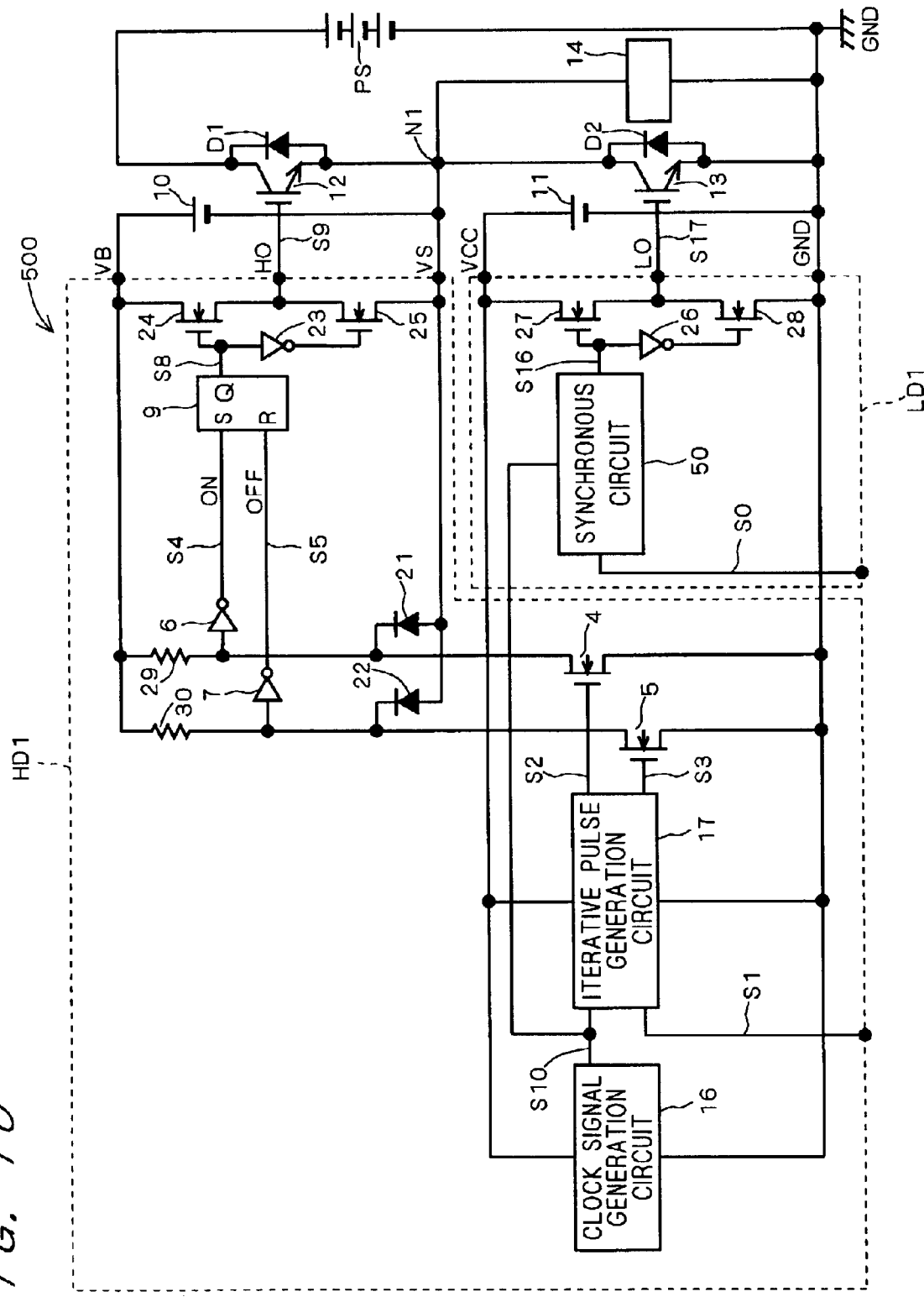
FIG. 10 illustrates the structure of a semiconductor device according to an embodiment 5 of the present invention.

FIG. 10 shows the structure of a level shifting circuit 500 as a semiconductor device according to an embodiment 5 of the present invention. Referring to FIG. 10, elements identical to those of the level shifting circuit 100 shown in FIG. 1 are denoted by the same reference numerals, to omit redundant description.

As shown in FIG. 10, the level shifting circuit 500 is divided into a high-potential side power device driving circuit HD1 and a low-potential side power device driving circuit LD1. The low-potential side power device driving circuit LD1 has a synchronous circuit 50 receiving an output signal S10 from a clock signal generation circuit 16 and an externally supplied input signal S0 and outputting a pulsing synchronous control signal S16 whose leading and trailing edges are set in correspondence to high-level transition (rising) and low-level transition (falling) of the input signal S0 and in synchronization with the leading edge of the pulse of the output signal S10.

The level shifting circuit 100 shown in FIG. 1 reduces influence exerted by an error pulse resulting from the dv/dt transient signal through the pulse generated from the clock signal generation circuit 16 originally provided therein, and a time delay results from displacement of the clock signal between the input signal S1 and the control signal S9 for the power device 12 if the timing when the pulse of the external input signal S1 is supplied and the timing of the pulse supplied from the clock signal generation circuit 16 mismatch with each other, as described above.

The low-potential side power device driving circuit LD forming the level shifting circuit 100 independently controls the power device 13 with the externally supplied input signal S0, and hence a time delay resulting from a signal delay or the like takes place between the input signal S0 and the control signal S17 for the power device 13. It is difficult to match this time delay with that resulting from displacement of the clock signal in the high-potential side power device driving circuit HD1 due to remarkable difference between the delay periods.

In the level shifting circuit 500, the synchronous circuit 50 synchronizes the input signal S0 with the output signal S10 from the clock signal generation circuit 16, thereby readily matching a time delay caused in the high-potential side power device driving circuit HD1 with that caused in the low-potential side power device driving circuit LD1.

<E-2. Device Operation>

Characteristic operations of the level shifting circuit 500 are now described with reference to timing charts shown in FIGS. 11 and 12.

Figure 11:
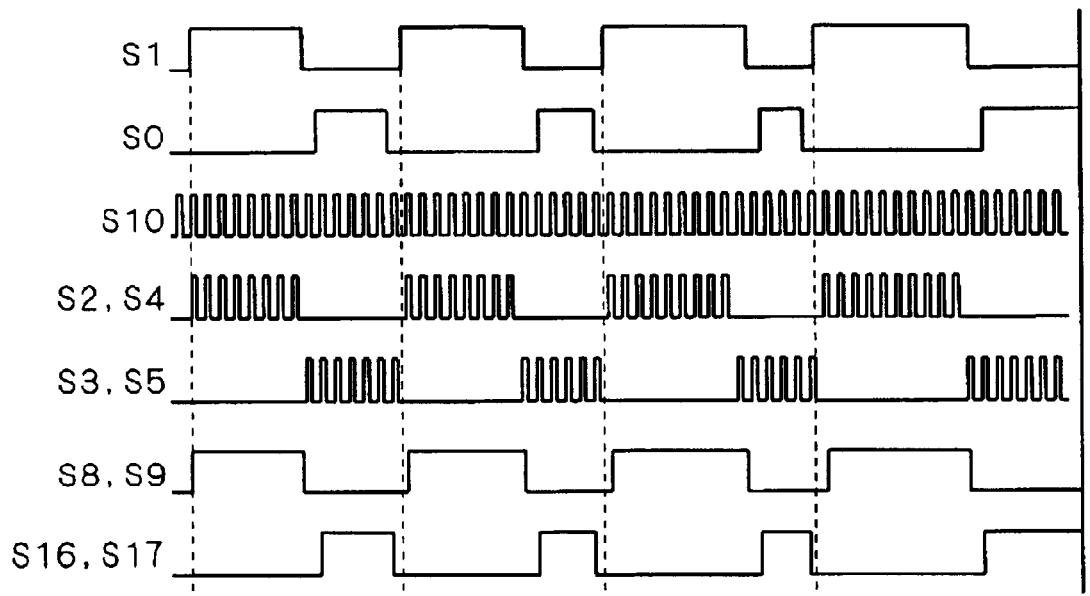
FIGS. 11 and 12 are timing charts illustrating operations of the semiconductor device according to the embodiment 5 of the present invention.

Referring to FIG. 11, timings of an input signal S1 supplied to the high-potential side power device driving circuit HD1, the output signal S10 from the clock signal generation circuit 16, ON and OFF signals S2 and S3, level-shifted ON and OFF signals S4 and S5, an output signal S8 from an SR flip-flop circuit 9 and a control signal S9 for a power device 12 are identical to those in the level shifting circuit 100 described with reference to FIGS. 1 to 3, and hence redundant description is omitted. Timings of an input signal S0 supplied to the low-potential side power device driving circuit LD1, a synchronous control signal S16 output from the synchronous circuit 50 and a control signal S17 for a power device 13 based on the synchronous control signal S16 are described with reference to FIG. 12 showing an enlarged view of FIG. 11.

The control signals S9 and S17 for the power devices 12 and 13 are substantially identical to the output signal S8 of the SR flip-flop circuit 9 and the synchronous control signal S16 respectively, and hence only the output signal S8 and the synchronous control signal S16 are mentioned in the following description.

Figure 12:
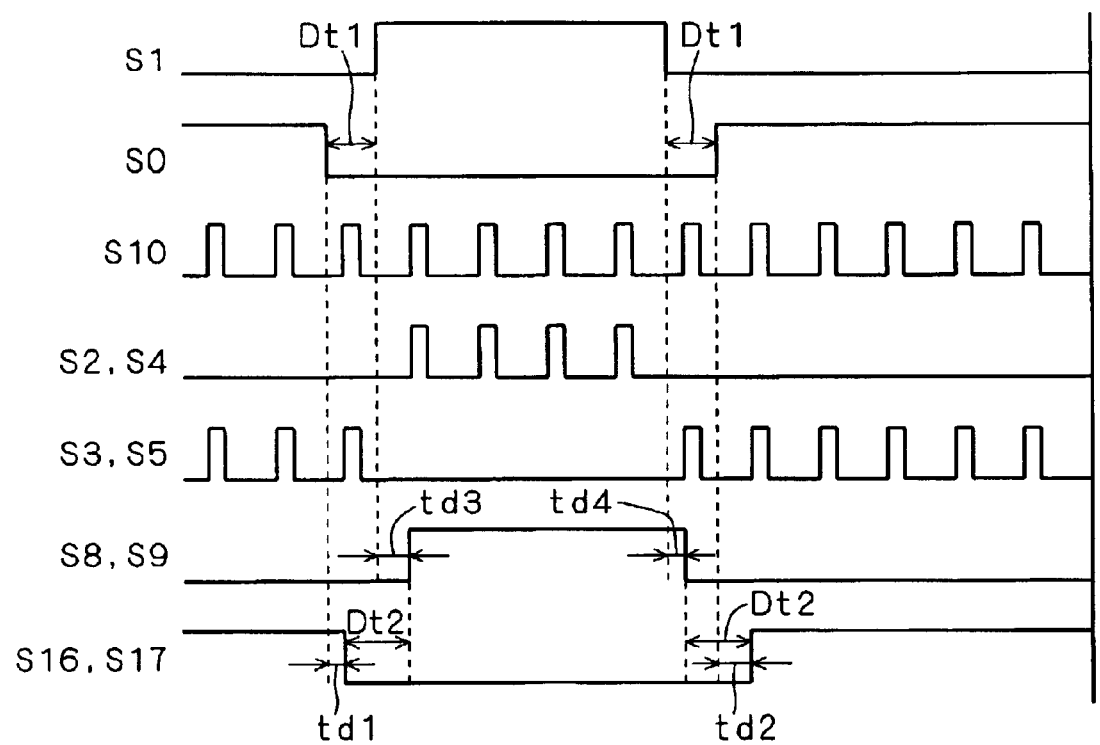

As shown in FIG. 12, the synchronous circuit 50 receiving the externally supplied input signal S0 lowers the synchronous control signal S16 on the leading edge of the pulse of the output signal S10 from the clock signal generation circuit 16 when the input signal S0 falls, and raises the synchronous control signal S16 on the leading edge of the pulse of eth output signal S10 when the input signal S0 rises.

FIG. 12 shows the displacement between the trailing edges of the input signal S0 and the synchronous control signal S16 as a time delay td1, while showing the displacement between the leading edges of the input signal S0 and the synchronous control signal S16 as a time delay td2. FIG. 12 also shows the displacement between the leading edges of the input signal S1 and the output signal S8 from the SR flip-flop circuit 9 as a time delay td3, while showing the displacement between the trailing edges of the input signal S1 and the synchronous control signal S8 as a time delay td4.

As shown in FIG. 12, all time delays td1 to td4 depend only on the clock signal S10 output from the clock signal generation circuit 16, whereby the time delays td1 to td4 can be readily matched with each other so that a period (dead time) when both of the power devices 12 and 13 are inactive can be readily ensured.

The power devices 12 and 13, basically operating complementarily with each other, must be prevented from simultaneously entering ON states, as described above. Therefore, the dead time is intentionally provided for preventing the power devices 12 and 13 from simultaneously entering ON states due to dispersion in element operation characteristics or the like.

Comparing the input signals S0 and S1 with each other, for example, the pulse widths are so set that the OFF period of the power device 13 is longer than the ON period of the power device 12, and a dead time Dt1 is ensured for signal change.

The level shifting circuit 500 deciding the time delays td1 to td4 only with reference to the clock signal S10 from the clock signal generation circuit 16 ensures a dead time Dt2 also in the relation between the output signal S8 and the synchronous control signal S16. The dead time Dt2 is characteristically longer than the dead time Dt1 due to the presence of the time delays td1 to td4, and the dead time Dt2 longer than the dead time Dt1 can be reliably ensured also when the previously set dead time Dt1 is shortened.

Therefore, the dead time Dt2, i.e., the period when the power devices 12 and 13 are inactive in practice can be consequently shortened for improving power efficiency.

Further, the length of the time delays td1 to td4 depending only on the clock signal S10 from the clock signal generation circuit 16 corresponds to that of one cycle of the clock signal S10 at the maximum and the range of the maximum to the minimum can be predicted while the dead time Dt2 is similarly predictable.

Therefore, indefinite elements are eliminated when setting the dead time Dt1, whereby the dead time Dt1 may not include a large margin but the period when the power devices 12 and 13 are inactive in practice can be shortened also in this point, for improving power efficiency.

<E-3. Function/Effect>

In the level shifting circuit 500 according to the embodiment 5 of the present invention, as hereinabove described, the low-potential side power device driving circuit LD1 is provided with the synchronous circuit 50 for synchronizing the output signal S10 from the clock signal generation circuit 16 with the external input signal S0, thereby readily matching the time delay caused in the high-potential side power device driving circuit HD1 with that caused in the low-potential side power device driving circuit LD1.

Further, the time delay is intentionally caused in the low-potential side power device circuit LD1, whereby the dead time can be readily controlled and the period when the power devices 12 and 13 are inactive in practice can be shortened for improving power efficiency. Further, indefinite elements are eliminated when setting the dead time, whereby the dead time may not include a large margin but power efficiency can be improved.

While the synchronous circuit 50 provided on the low-potential side power device driving circuit LD1 is supplied with the output signal S10 from the clock signal generation circuit 16 in the above description, the synchronous circuit 50 may alternatively be provided on the low-potential side power device driving circuit LD in the structure employing the external clock signal as the signal S10 as in the level shifting circuit 200 described with reference to FIG. 4.

<F. Embodiment 6>
<F-1. Device Structure>

Figure 13:
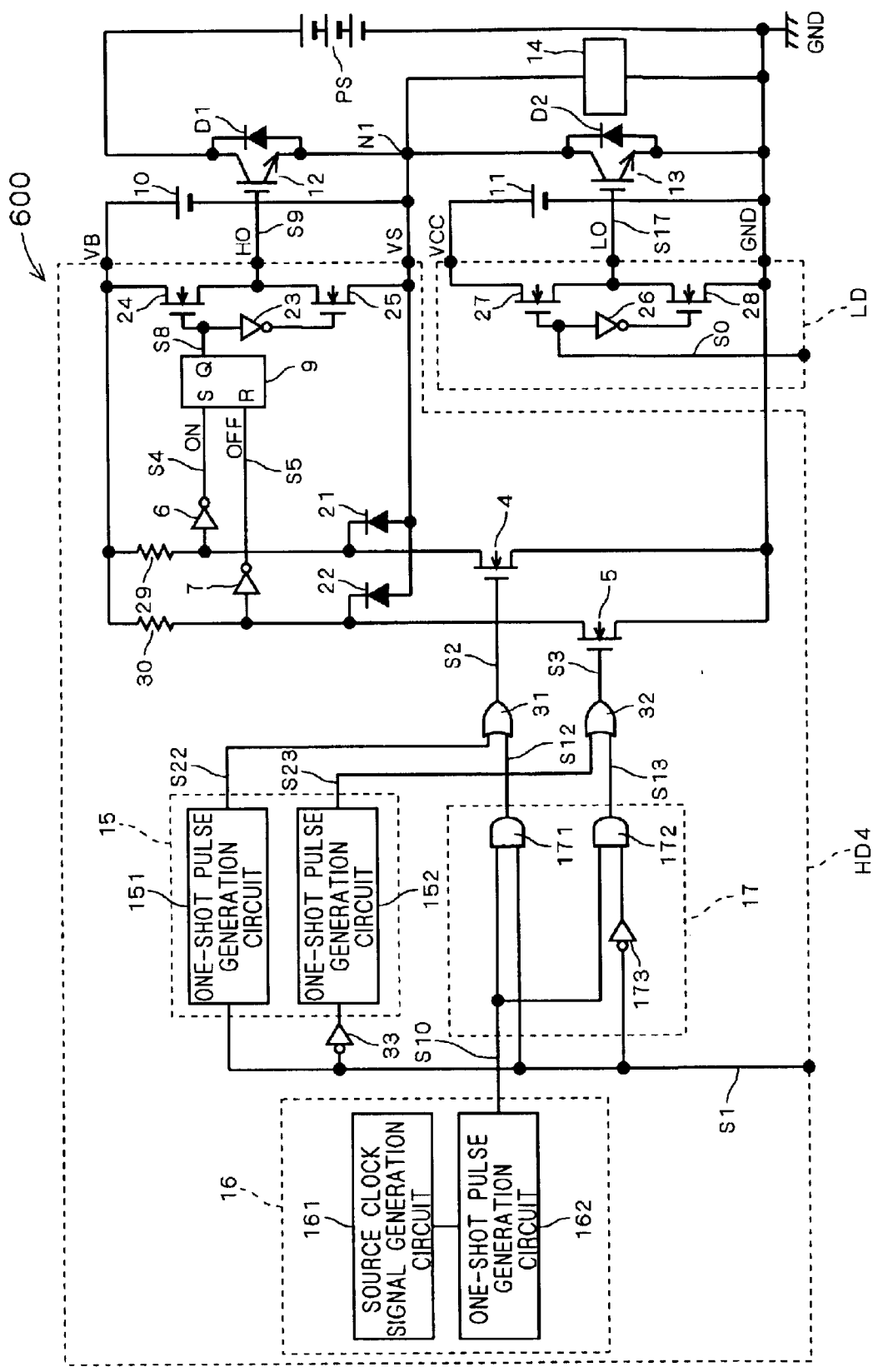
FIG. 13 illustrates the structure of a semiconductor device according to an embodiment 6 of the present invention.

FIG. 13 shows the structure of a level shifting circuit 600 as a semiconductor device according to an embodiment 6 of the present invention. Referring to FIG. 13, elements identical to those of the level shifting circuit 100 shown in FIG. 1 are denoted by the same reference numerals, to omit redundant description.

As shown in FIG. 13, the level shifting circuit 600 is divided into a high-potential side power device driving circuit HD4 and a low-potential side power device driving circuit LD. The high-potential side power device driving circuit HD4 comprises a one-shot pulse generation part 15 in addition to a clock signal generation circuit 16 and an iterative pulse generation circuit 17.

The one-shot pulse generation part 15, outputting a pulse of a prescribed width on the leading (or trailing) edge of an input pulse, has one-shot pulse generation circuits 151 and 152 for ON and OFF signals S2 and S3 respectively.

The one-shot pulse generation circuits 151 and 152 are general circuits, and similar ones are provided also in the clock signal generation circuit 16.

As shown in FIG. 13, the clock signal generation circuit 16 has a source clock signal generation circuit 161 and a one-shot pulse generation circuit 162, for generating a pulse of a prescribed width in the one-short pulse generation circuit 162 on the basis of a pulse signal generated in the source clock signal generation circuit 161 and outputting the same as a signal S10.

Figure 14:
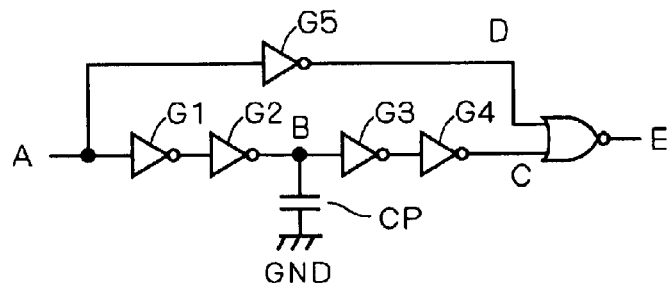
FIG. 14 illustrates an exemplary structure of a one-shot pulse generation circuit.
Figure 15:
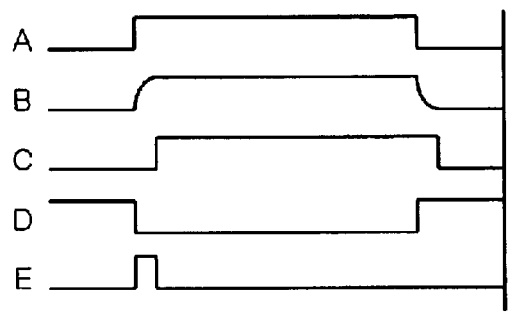
FIG. 15 is a timing chart illustrating operations of the one-shot pulse generation circuit.

FIG. 14 shows an exemplary structure of the one-shot pulse generation circuit and FIG. 15 is a timing chart of operations thereof.

As shown in FIG. 14, the one-shot pulse generation circuit includes serially connected four inverter circuits G1, G2, G3 an G4, an inverter circuit G5 arranged in parallel with the inverter circuits G1 to G4, a NOR circuit G6 receiving outputs of the inverter circuits G4 and G5 and a capacitor CP arranged between the node of the inverter circuits G2 and G3 and a ground potential GND. The inverter circuits G1 and G5 receive a common signal.

FIG. 15 shows signal states on a signal input part A of the inverter circuits G1 and G5, the node B of the inverter circuits G2 ad G3, an output point C of the inverter circuit G4, an output point D of the inverter circuit G5 and an output point E of the NOR circuit G6 respectively.

A pulse externally input in the input part A corresponds to a signal supplied from the source clock signal generation circuit 161 in the clock signal generation circuit 16, and corresponds to the external input signal S1 in the one-shot pulse generation circuits 151 and 152.

A pulse input in the inverter circuit G1 is dulled in waveform in the node B due to the presence of the capacitor CP, and is repaired on the point C through the inverter circuits G3 and G4. However, a delay results from this dulling of the waveform.

On the other hand, a pulse input in the inverter circuit G5 is inverted in the point D and output with no delay. When signals on the points C and D are input in the NOR circuit G6, therefore, it follows that a one-shot pulse having a pulse width corresponding to a signal delay width is obtained on the point E. It follows that the leading edge of this one-shot pulse is synchronized with the leading edge of the externally input pulse.

Thus, a pulse synchronous with the leading edge of the input pulse and having a prescribed width set by the structure in the circuit can be obtained by inputting the pulse in the one-shot pulse generation circuit.

Referring again to FIG. 13, the external input signal S1 is input in the one-shot pulse generation circuit 151, while an inverted signal of the input signal S1 is input in the one-shot pulse generation circuit 152.

An output signal S22 from the one-shot pulse generation circuit 151 is input in an OR circuit 31 along with an output signal S12 from an AND circuit 171 forming an iterative pulse generation circuit 17, while an output signal S23 from the one-shot pulse generation circuit 152 is input in an OR circuit 32 along with an output signal S13 from an AND circuit 172 forming the iterative pulse generation circuit 17.

An output signal S2 from the OR circuit 31 is supplied to an HNMOS transistor 4 as an ON signal, while an output signal S3 from the OR circuit S3 is supplied to an HNMOS transistor 5 as an OFF signal.

<F-2. Device Operation>

Characteristic operations of the level shifting circuit 600 are now described with reference to a timing chart shown in FIG. 16.

Figure 16:
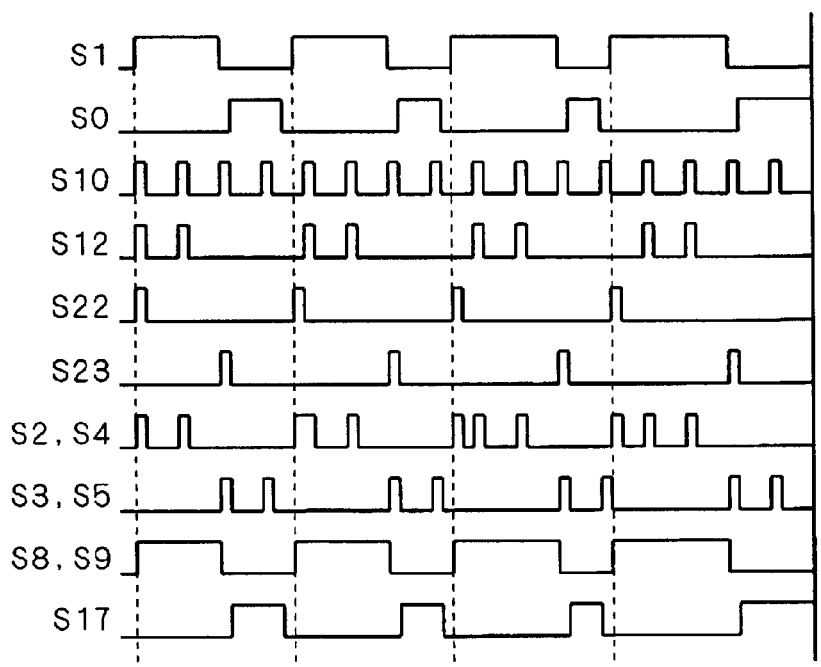
FIG. 16 is a timing chart illustrating operations of the semiconductor device according to the embodiment 6 of the present invention.

Referring to FIG. 16, timings of the input signal S1 supplied to the high-potential side power device driving circuit HD4, the input signal S0 supplied to the low-potential side power device driving circuit LD and the output signal S10 from the clock signal generation circuit 16 are identical to those in the level shifting circuit 100 described with reference to FIGS. 1 to 3, and hence redundant description is omitted. The trailing edge of the input signal S1 is synchronized with the trailing edge of the output signal S10 from the clock signal generation circuit 16 for convenience, in order to simplify the illustration.

As shown in FIG. 16, the output signal S12 from the AND circuit 171 is asynchronous with the input signal S1, and hence the leading edge of the first pulse of the output signal S12 supplied in correspondence to each cycle of the input signal S1 is slightly displaced.

However, the leading edge of the pulse of the output signal S22 from the one-shot pulse generation circuit 151 is synchronized with the input signal S1, and hence the leading edge of the first pulse of the output signal (ON signal) S2 from the OR circuit 31 defined by the OR (logical add) of the output signals S22 and S12 is invariably synchronized with the leading edge of the input signal S1 in each cycle of the input signal S1. The pulse arrangement of the output signal S2 is irregularized due to the operation of the OR of the output signals S22 and S12.

The output signal (OFF signal) S3 from the OR circuit 32 is also defined by operating the OR of the output signal S23 and the output signal S13 (not shown), the pulse (not shown) of the output signal S13 is synchronized with the trailing edge of the input signal S1 and hence the pulse arrangement of the output signal S3 keeps regularity.

The level-shifted ON and OFF signals S4 and S5 are also similar signals, whereby it follows that the output signal S8 from the SR flip-flop circuit 9 and the control signal S9 for the power device 12 match with the input signal S1

<F-3. Function/Effect>

As hereinabove described, the level shifting circuit 600 according to the embodiment 6 of the present invention comprises the one-shot pulse generation part 15 generating the one-shot pulse synchronized with the external input signal S1 and uses the signals obtained by operating the ORs of the respective ones of the output signals S22 and S23 from the one-shot pulse generation part 15 and the output signals S12 and S13 as the ON and OFF signals S2 and S3 respectively, whereby it follows that the leading edge of the first pulse of the ON signal S2 is invariably synchronized with the leading edge of the input signal S1 in each cycle of the input signal S1, whereby the leading edges of the input signal S1 and the control signal S9 for the power device 12 can be consequently matched with each other and the power device 12 can be prevented from reduction in response speed by eliminating time delays. While the trailing edge of the input signal S1 is generally asynchronous with the output signal S10 from the clock signal generation circuit 16, the trailing edges of the input signal S1 and the control signal S9 can be matched with each other by a function similar to the above also in this case.

<G. Embodiment 7>

<G-1. Device Structure>

Figure 17:
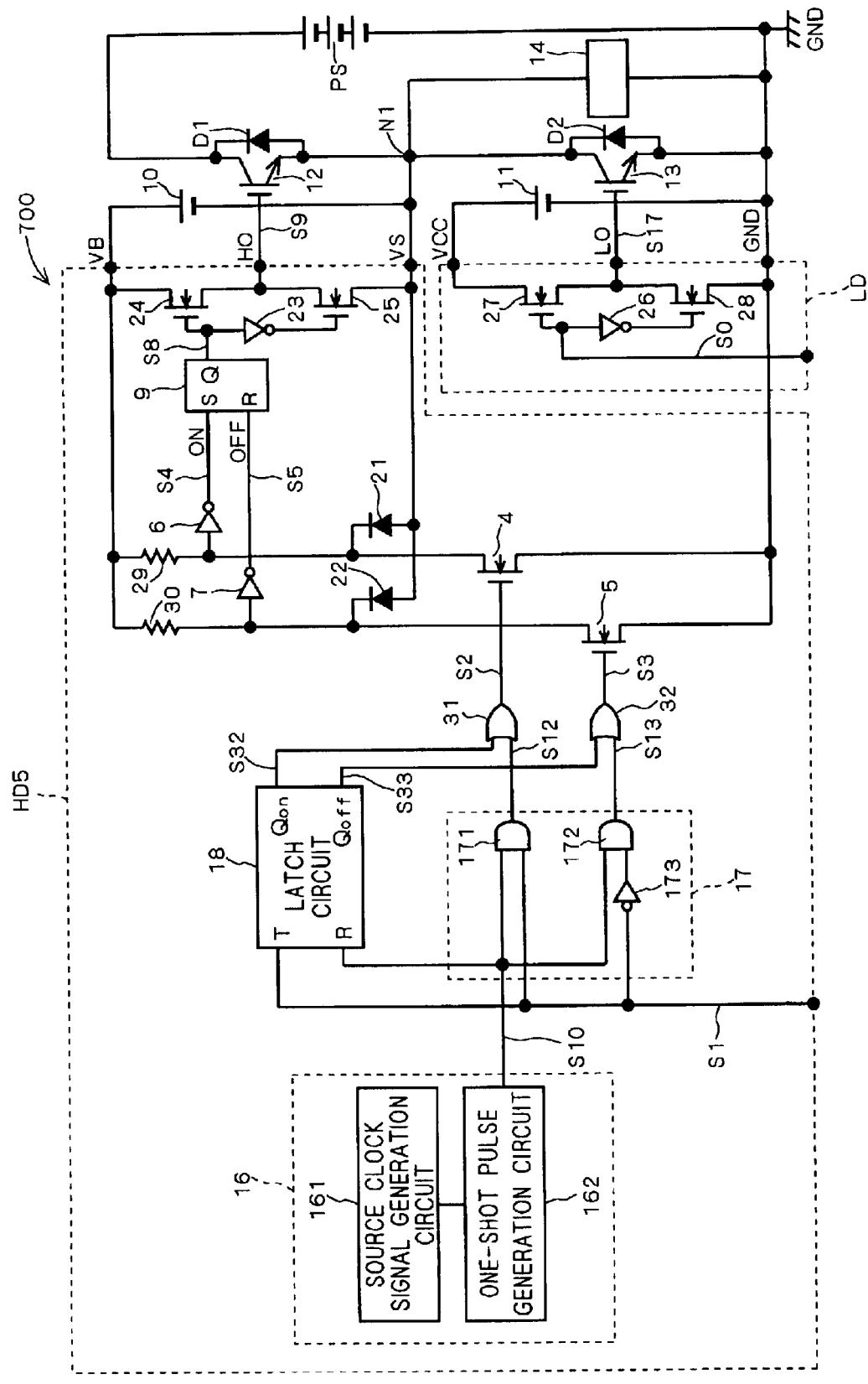
FIG. 17 illustrates the structure of a semiconductor device according to an embodiment 7 of the present invention.

FIG. 17 shows the structure of a level shifting circuit 700 as a semiconductor device according to an embodiment 7 of the present invention. Referring to FIG. 17, elements identical to those of the level shifting circuit 600 shown in FIG. 13 are denoted by the same reference numerals, to omit redundant description.

As shown in FIG. 17, the level shifting circuit 700 is divided into a high-potential side power device driving circuit HD5 and a low-potential side power device driving circuit LD. The high-potential side power device driving circuit HD5 comprises a latch circuit 18 in place of the pulse generation part 15 of the level shifting circuit 600 shown in FIG. 13.

The latch circuit 18 has a T input supplied with an external input signal S1 and a reset input supplied with an output signal S10 from a clock signal generation circuit 16.

An output signal S32 from a Qon output of the latch circuit 18 is input in an OR circuit 31 along with an output signal S12 from an AND circuit 171 forming an iterative pulse generation circuit 17 while an output signal S33 from a Qoff output of the latch circuit 18 is input in an OR circuit 32 along with an output signal S13 from an AND circuit 172 forming the iterative pulse generation circuit 17.

According to this structure, it follows that the Qon output is set on the leading edge of the input signal S1, the Qoff output is set on the trailing edge of the input signal S1, and both of the Qon and Qoff outputs are reset on the leading edge of the pulse of the input signal S10 from the clock signal generation circuit 16 in the latch circuit 18.

<G-2. Device Operation>

Characteristic operations of the level shifting circuit 700 are now described with reference to a timing chart shown in FIG. 18.

Figure 18:
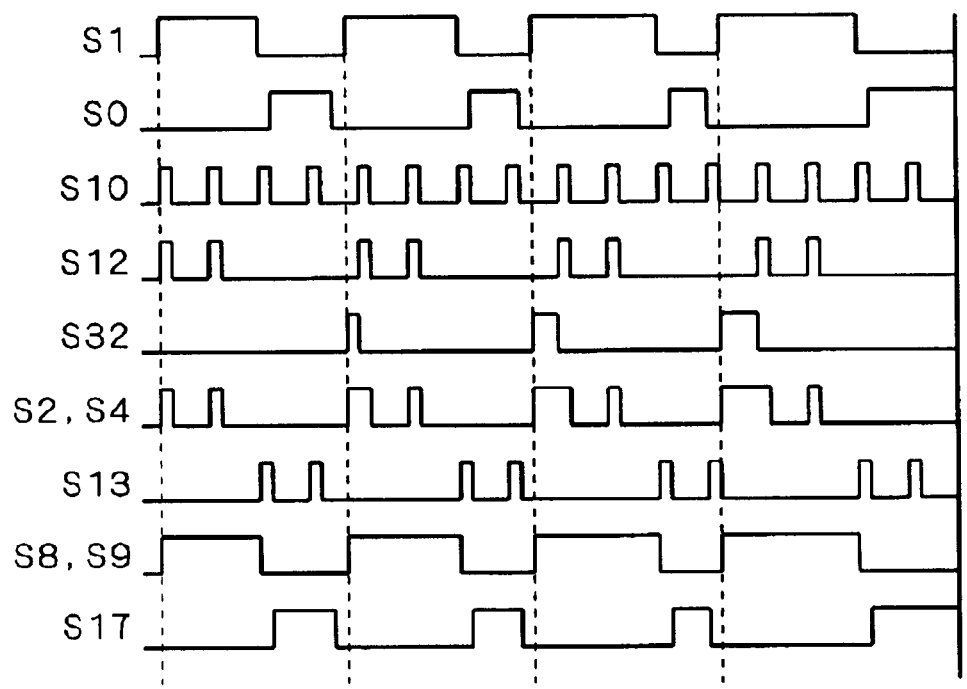
FIG. 18 is a timing chart illustrating operations of the semiconductor device according to the embodiment 7 of the present invention.

Referring to FIG. 18, timings of the input signal S1 supplied to the high-potential side power device driving circuit HD5, an input signal S0 supplied to the low-potential side power device driving circuit LD, the output signal S10 from the clock signal generation circuit 16 and the output signal S12 from the AND circuit 171 are identical to those in the level shifting circuit 600 described with reference to FIG. 16, and hence redundant description is omitted.

As shown in FIG. 18, the output signal S32 from the Qon output of the latch circuit 18 is set on the leading edge of the pulse of the input signal S1 and reset on the leading edge of the pulse of the output signal S10. Therefore, the pulse width thereof corresponds to the displacement between the leading edge of the first pulse of the output signal S10 in each cycle of the input signal S1 and the leading edge of the pulse of the input signal S1. This displacement varies with each cycle of the input signal S1, and hence respective pulses of the output signal S32 are different from each other.

As to the output signal S33 from the Qoff output of the latch circuit 18, the Qoff output is not set since the trailing edge of the pulse of the input signal S1 is synchronized with the leading edge of the output signal S10 and hence it follows that the output signal S33 has no pulse.

The leading edge of the first pulse of the output signal (ON signal) S2 from the OR circuit 31 defined by the OR of the output signal S32 having different widths of pulses and the output signal S12 from the AND circuit 171 is invariably synchronized with the leading edge of the input signal S1. The pulse arrangement of the output signal S2 is irregularized due to the operation of the OR of the output signals S32 and S12.

The level-shifted ON signal S4 is also similar, whereby it follows that the output signal S8 from the SR flip-flop circuit 9 and the control signal S9 for the power device 12 consequently match with the input signal S1.

<G-3. Function/Effect>

As hereinabove described, the level shifting circuit 700 according to the embodiment 7 of the present invention comprises the latch circuit 18 having the output set in synchronization with the external input signal S1 and reset on the leading edge of the pulse of the output signal S10 from the clock signal generation circuit 16 and uses the signals obtained by operating the ORs of the respective ones of the output signals S32 and S33 from the latch circuit 18 and the output signals S12 and S13 respectively, whereby it follows that the leading edge of the first pulse of the ON signal S2 is invariably synchronized with the leading edge of the input signal S1 in each cycle of the input signal S1 so that the leading edges of the input signal S1 and the control signal S9 for the power device 12 can be consequently matched with each other for eliminating time delays and preventing the power device 12 from reduction in response speed. While the trailing edge of the input signal S1 is generally asynchronous with the output signal S10 from the clock signal generation circuit 16, the trailing edges of the input signal S1 and the control signal S9 can be matched by a function similar to the above also in this case.

<H. Embodiment 8>

<H-1. Device Structure>

Figure 19:
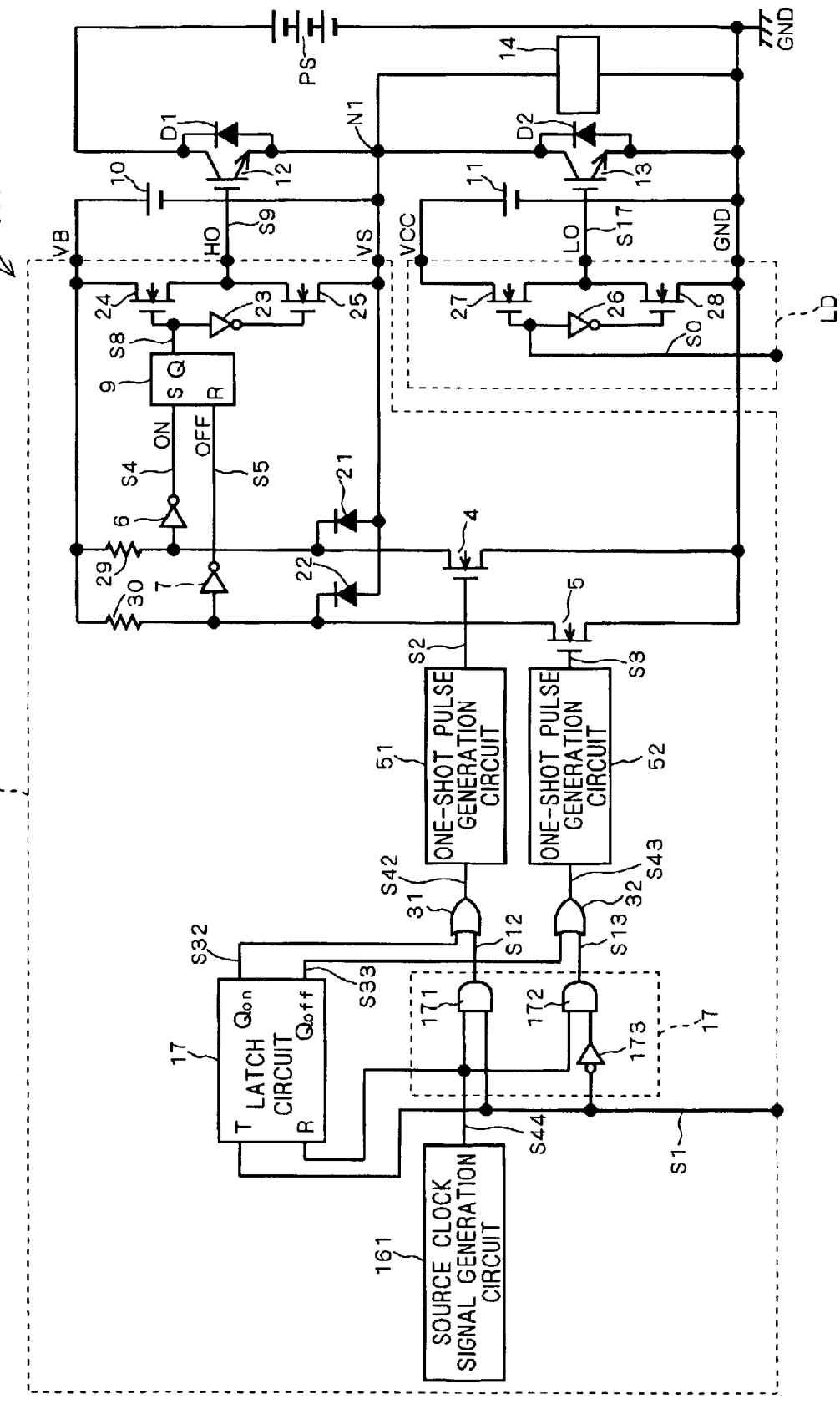
FIG. 19 illustrates the structure of a semiconductor device according to an embodiment 8 of the present invention.

FIG. 19 shows the structure of a level shifting circuit 800 as a semiconductor device according to an embodiment 8 of the present invention. Referring to FIG. 19, elements identical to those of the level shifting circuit 700 shown in FIG. 17 are denoted by the same reference numerals, to omit redundant description.

As shown in FIG. 19, the level shifting circuit 800 is divided into a high-potential side power device driving circuit HD6 and a low-potential side power device driving circuit LD. In the high-potential side power device driving circuit HD6, a source clock signal generation circuit 161 forming a clock signal generation circuit 16 is arranged in place of the clock signal generation circuit 16 employed in the level shifting circuit 700. A source clock signal S44 output from the source clock signal generation circuit 161 is supplied to inputs of AND circuits 171 and 172 forming an iterative pulse generation circuit 17 and a reset input of a latch circuit 18.

An output signal S42 defined by the OR (logical add) of an output signal S32 from a Qon output of the latch circuit 18 and an output signal S12 from the AND circuit 171 is input in a one-shot pulse generation circuit 51, whose output signal S2 is supplied to an HNMOS transistor 4 as an ON signal, while an output signal S43 from an OR circuit 32 defined by the OR of an output signal S33 from a Qoff output of the latch circuit 18 and an output signal S13 from the AND circuit 172 is input in a one-shot pulse generation circuit 52, whose output signal S3 is supplied to an HNMOS transistor 5 as an OFF signal.

<H-2. Device Operation>

Characteristic operations of the level shifting circuit 800 are described with reference to a timing chart shown in FIG. 20.

Referring to FIG. 20, timings of an input signal S1 supplied to the high-potential side power device driving circuit HD6, an input signal S0 supplied to the low-potential side power device driving circuit LD and the output signal S10 from the clock signal generation circuit 16 are identical to those in the level shifting circuit 600 described with reference to FIG. 16, and hence redundant description is omitted.

As shown in FIG. 20, the source clock signal S44 output from the source clock signal generation circuit 161 is a pulse having a relatively large width.

The output signal S12 from the AND circuit 171 is asynchronous with the input signal S1, and hence the leading edge of the first pulse of the output signal S12 supplied in correspondence to each cycle of the input signal S1 is slightly displaced.

It follows that the output signal S32 from the Qon output of the latch circuit 18 is set on the leading edge of the pulse of the input signal S1 and reset on the leading edge of the pulse of the source clock signal S44, and hence the pulse width thereof corresponds to the displacement between the leading edge of the first pulse of the source clock signal S44 in each cycle of the input signal S1 and the leading edge of the pulse of the input signal S1. This displacement varies with each cycle of the input signal S1, and hence the widths of the respective pulses of the output signal S32 are different from each other.

As to the output signal S33 from the Qoff output of the latch circuit 18, the Qoff output is not set since the trailing edge of the pulse of the input signal S1 is synchronized with the leading edge of the source clock signal S44 and hence it follows that the output signal S33 has no pulse.

The leading edge of the first pulse of the output signal S42 from the OR circuit 31 defined by the OR of the output signal S32 having different widths of pulses and the output signal S12 from the AND circuit 171 is invariably synchronized with the leading edge of the input signal S1 in each cycle of the input signal S1. The pulse arrangement of the output signal S42 is irregularized due to the operation of the OR of the output signals S32 and S12.

Further, the output signal S42 is input in the one-shot pulse generation circuit 51, and reduced in pulse width, i.e., reduced in duty ratio through a mechanism described with reference to FIGS. 14 and 15, for forming the ON signal S2.

The output signal S43 defined by operating the OR of the output signals S33 and S13 is also similarly processed in the one-shot pulse generation circuit 52, for forming the OFF signal S3. While the trailing edge of the input signal S1 is generally asynchronous with the leading edge of the source clock signal S44, it follows that the output signal S43 from the OR circuit 32 is synchronized with the trailing edge of the input signal S1 through a function similar to the above also in this case.

The level-shifted ON and OFF signals S4 and S5 are also similar to the ON and OFF signals S2 and S3, whereby it follows that the output signal S8 from the SR flip-flop circuit 9 and the control signal S9 for the power device 12 consequently match with the input signal S1.

<H-3. Function/Effect>

As hereinabove described, the level shifting circuit 800 according to the embodiment 8 of the present invention obtains the ON and OFF signals S2 and S3 reduced in pulse width by passing the output signals S42 and S43 obtained by operating the ORs of the respective ones of the output signals S32 and S33 from the latch circuit 18 and the output signals S12 and S13 respectively through the one-shot pulse generation circuits 51 and 52, whereby the duty ratios of the ON and OFF signals S3 are reduced so that operating times of the HMOS transistors 4 and 5 can be reduced for reducing power consumption.

<I. Embodiment 9>

<I-1. Structure Comprising Filter Circuit>

In each of the aforementioned embodiments 1 to 8, the signals S4 and S5 level-shifted by the HNMOS transistors 4 and 5 and inverted by the inverter circuits 6 and 7 are supplied to the set input and the reset input of the SR flip-flop circuit 9.

However, the generally employed filter circuit 8 may be electrically interposed between the inverter circuits 6 and 7 and the SR flip-flop circuit 9 for preventing the SR flip-flop circuit 9 from simultaneous signal inputs when error pulses resulting from a dv/dt transient signal are simultaneously supplied as signals S2 and S3, as a matter of course.

Figure 21:
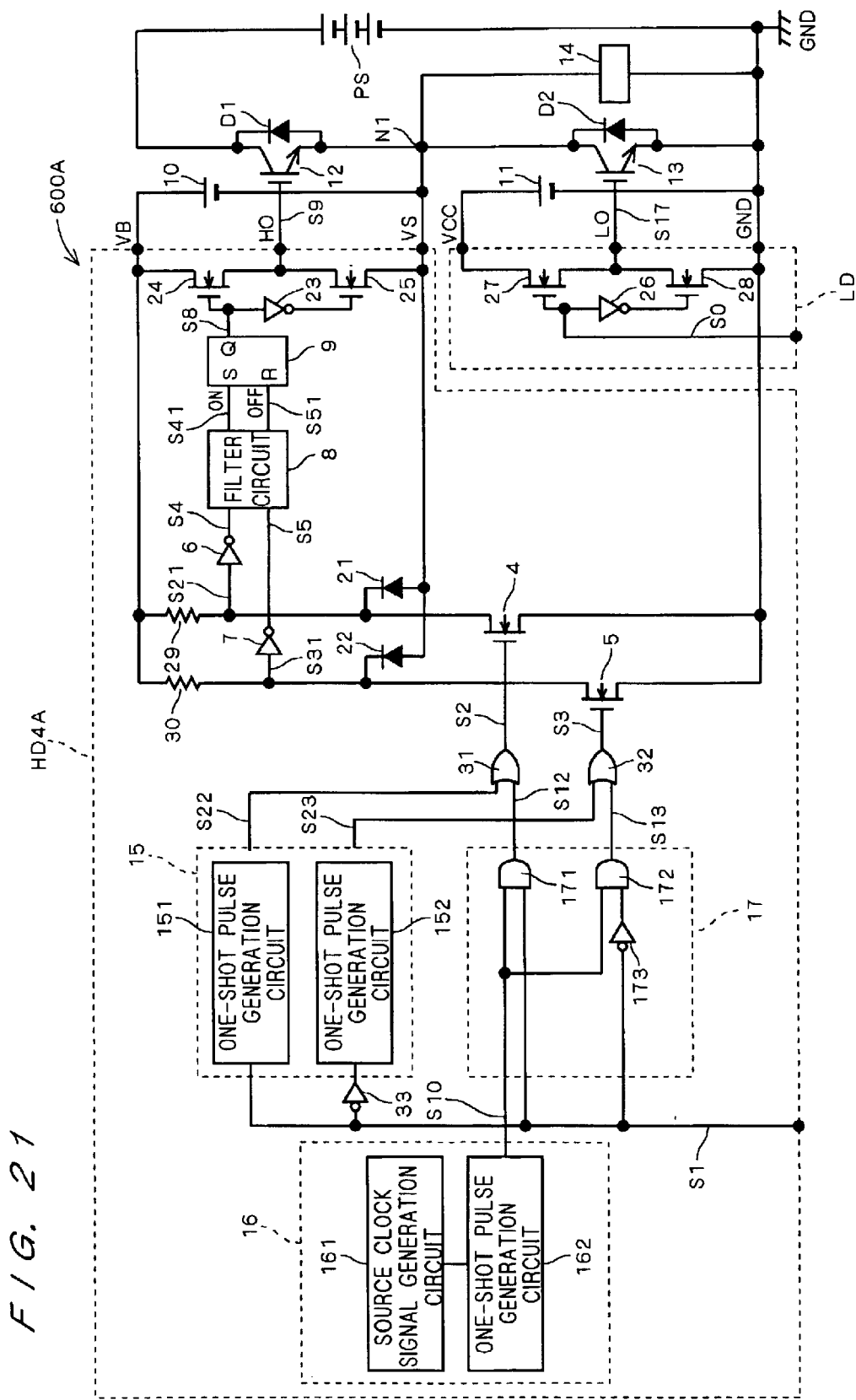
FIG. 21 illustrates a structure providing a filter circuit on the semiconductor device according to the embodiment 6 of the present invention.

FIG. 21 shows the structure of a level shifting circuit 600A comprising a high-potential side power device driving circuit HD4A having a filter circuit 8. Referring to FIG. 21, structures identical to those of the level shifting circuit 600 shown in FIG. 13 are denoted by the same reference numerals, to omit redundant description.

As shown in FIG. 21, outputs of inverter circuits 6 and 7 are connected to inputs of the filter circuit 8, and outputs of the filter circuit 8 are connected to a set input and a reset input of an SR flip-flop circuit 9. FIG. 21 shows signals level-shifted by HNMOS transistors 4 and 5 as signals S21 and S31 respectively, while showing signals supplied from the filter circuit 8 to the set input and the reset input of the SR flip-flop circuit 9 as signals S41 and S51 respectively.

Figure 22:
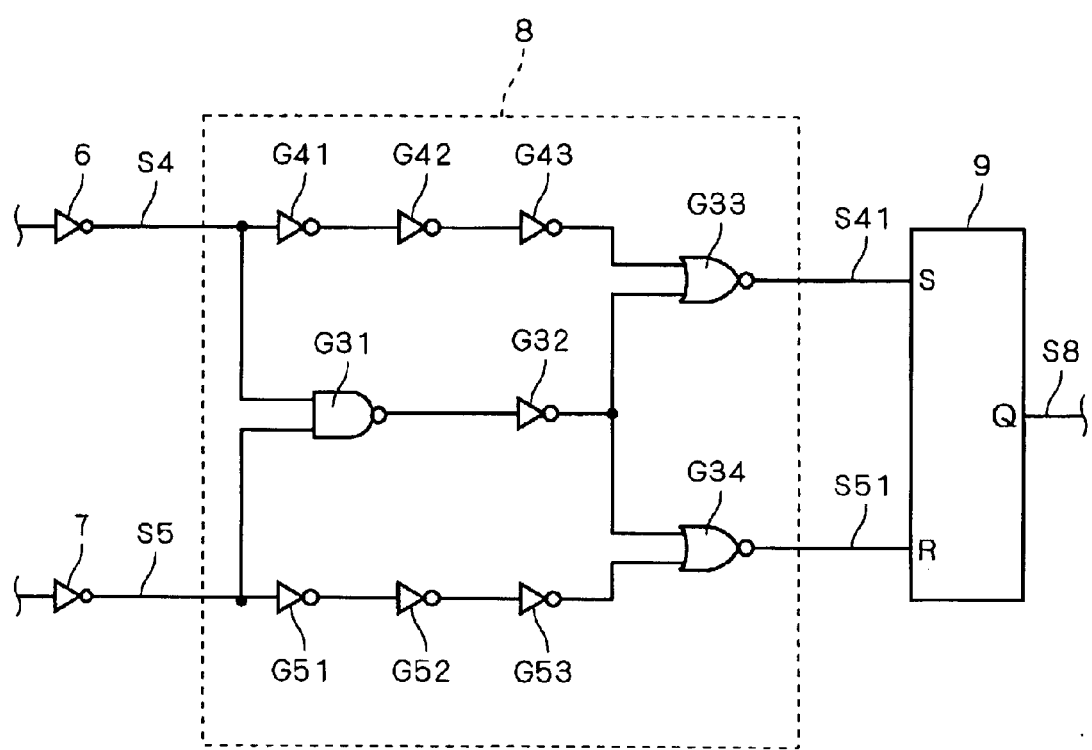
FIG. 22 illustrates the structure of the filter circuit.

FIG. 22 shows an exemplary structure of the filter circuit 8. As shown in FIG. 22, the filter circuit 8 has a NAND circuit G31 supplied with output signals S4 and S5 from the inverter circuits 6 and 7, an inverter circuit G32 supplied with an output of the NAND circuit G31 and NOR circuits G33 and G34 supplied with an output of the inverter circuit G32. The output signal S4 from the inverter circuit 6 is supplied to the NOR circuit G33 through serially connected inverter circuits G41, G42 and G43, while the output signal S5 from the inverter circuit 7 is supplied to the NOR circuit G34 through serially connected inverter circuits G51, G52 and G53. The output signals S41 and S51 from the NOR circuits G33 and G34 are supplied to the set input and the reset input of the SR flip-flop circuit 9 as the outputs of the filter circuit 8.

The NAND circuit G31 may be replaced with an inversion-input OR circuit, and the NOR circuits G33 and G34 may be replaced with inversion-input AND circuits.

The aforementioned exemplary structure of the filter circuit 8 corresponds to one of filter circuits disclosed in Japanese Patent Laying-Open Gazette No. 9-200017 (1997), and the present invention is not restricted to the aforementioned structure so far as both of the outputs of the filter circuit 8 (the output signals S41 and S51 from the NOR circuits G33 and G34 in this case) can be set low when high-level signals are simultaneously supplied as the signals S4 and S5 due to a dv/dt transient signal.

In this case, low-level signals are supplied to the set input and the reset input of the SR flip-flop circuit 9, which in turn holds a Q output.

Thus, the filter circuit 8 is so provided as to prevent the SR flip-flop circuit 9 from simultaneous supply of error pulses resulting from a dv/dt transient signal as well as from a malfunction. Also when error pulses resulting from a dv/dt transient signal are supplied with time difference, an iterative pulse supplied from an iterative pulse generation circuit 17 limits a period for shorting power devices 12 and 13, whereby the power devices 12 and 13 can be protected. While the filter circuit 8 is provided on the level shifting circuit 600 shown in FIG. 13 in the above description, the filter circuit 8 may be provided in any of the level shifting circuits, such as the level shifting circuit 100 shown in FIG. 1, according to the embodiments 1 to 8 of the present invention, as a matter of course.

In the level shifting circuit 600A shown in FIG. 21, a one-shot pulse generation part 15 outputs a one-shot pulse on the leading and trailing edges of an input signal S1 for forming the signals S2 and S3 by ORing this pulse and the iterative pulse and controlling the HNMOS transistors 4 and 5, whereby signal transmission is necessarily performed on the edge of the input signal S1 and an input/output transmission delay time between times for receiving the input signal S1 and obtaining the output signals is constant in an ideal state.

<I-2. Jitter of Input/Output Transmission Delay Time>

In the actual device, however, the input/output transmission delay time is changed in the range of several 10 to 100-odd nsec. every time the input signal S1 is switched, and observed as a jitter. The jitter of the input/output transmission delay time is now described.

Figure 23:
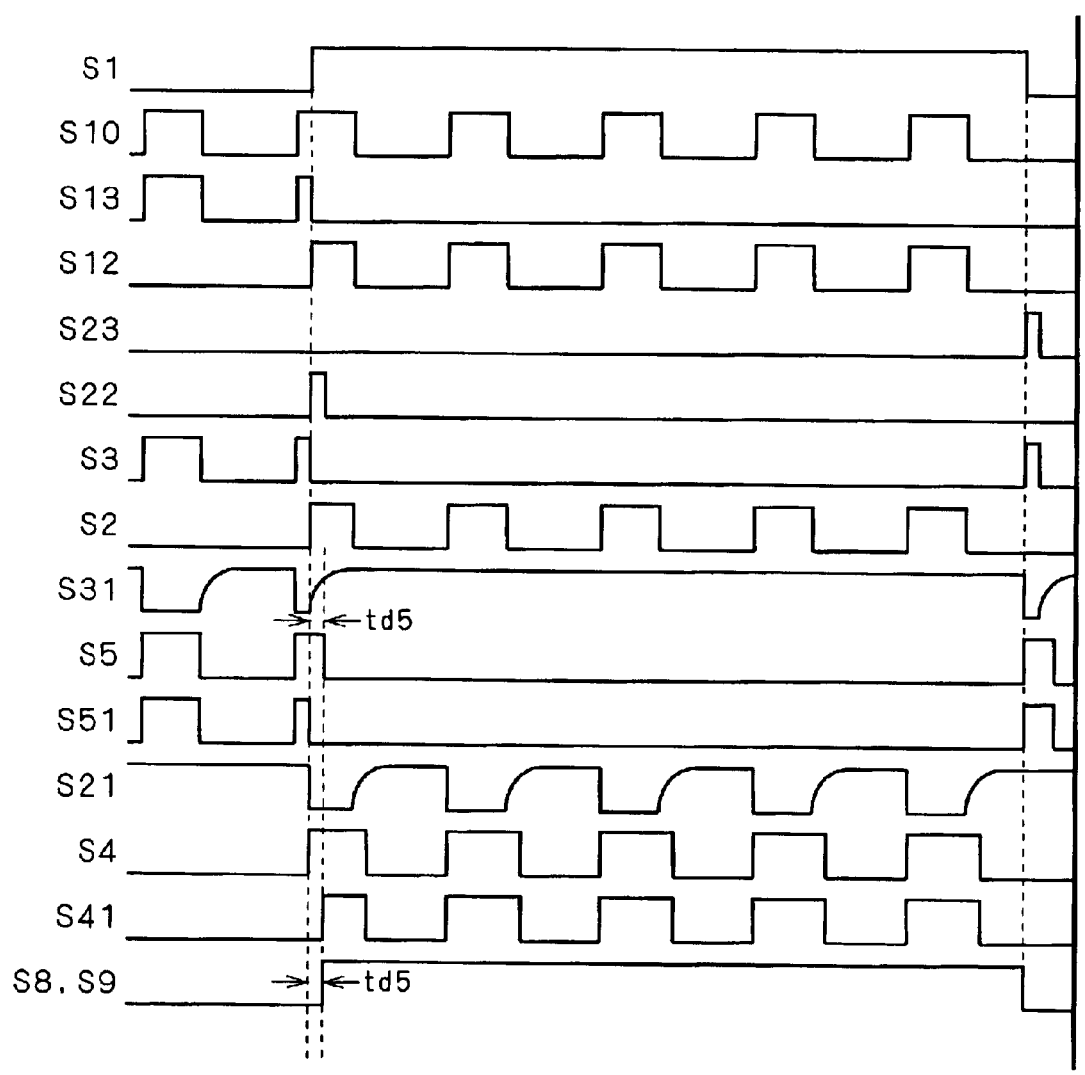
FIGS. 23 and 24 are timing charts illustrating operations of the structure comprising the filter circuit.

FIG. 23 is a timing chart illustrating operations of the level shifting circuit 600A. Referring to FIG. 23, redundant description is omitted as to signals exhibiting operations similar to those of the level shifting circuit 600 shown in FIG. 13.

FIG. 23 shows a case where the input signal S1 is switched from an OFF command, i.e., a low-level state to an ON command, i.e., a high-level state.

Assuming that the input signal S1 is switched from an OFF command to an ON command when the signal S3 (may be hereinafter referred to as an internal OFF signal) based on the iterative pulse is valid (high) as the prerequisite, the signal S2 (may be hereinafter referred to as an internal ON signal) based on the iterative pulse is rendered valid at the same time when the internal OFF signal S3 is forcibly cut off.

It is problematic that valid states of the internal ON signal S2 and the internal OFF signal S3 are in proximity to each other.

As described above, the internal ON signal S2 and the internal OFF signal S3 are level-shifted through the HNMOS transistors 4 and 5 respectively and inverted by the inverter circuits 6 and 7 to form the signal S4 (may be hereinafter referred to as an internal ON command signal) and the signal S5 (may be hereinafter referred to as an internal OFF command signal).

Therefore, the internal ON signal S2 and the internal OFF signal S3 are influenced by time constants decided by the parasitic capacitances (drain-to-source parasitic capacitances) of the HNMOS transistors 4 and 5 and resistors 29 and 30 and thresholds of the inverter circuits 6 and 7 before the same are supplied to the filter circuit 8 as the signals S4 and S5 respectively. The signals S2 and S3 may also be influenced by a dv/dt transient signal in switching of the power devices 12 and 13.

In particular, it follows that switching timing for the internal OFF command signal S5 is remarkably influenced by the time constant decided by the parasitic capacitance of the HNMOS transistor 5 and the resistor 30 and delayed beyond switching timing for the internal OFF signal S3. This deviation in timing is referred to as a time delay td5. The signals S21 and S31 level-shifted by the HNMOS transistors 4 and 5 loosely rise due to the time constants.

While the time delay td5 is not so large, the internal ON command signal S4 and the internal OFF command signal S5 are simultaneously rendered valid, i.e., set high when the valid states the internal ON signal S2 and the internal OFF signal S3 are in proximity to each other.

While the level shifting circuit 600A comprises the filter circuit 8 for preventing the SR flip-flop circuit 9 from simultaneous supply of error pulses resulting from a dv/dt transient signal, the filter circuit 8 also operates when the internal ON command signal S4 and the internal OFF command signal S5 are simultaneously rendered valid due to the aforementioned operation.

In other words, both of the output signals S41 and S51 from the filter circuit 8 remain low while the internal ON command signal S4 and the internal OFF command signal S5 are high at the same time, i.e., in the period of the time delay td5, and an output signal S8 from the SR flip-flop circuit 9 consequently remains low and makes transition to a high level after a lapse of the time delay td5.

Also when the input signal S1 is switched from a low level to a high level, therefore, a control signal S9 for the power device 12 output from the high-potential side power device driving circuit HD4A is not switched up to the lapse of the time delay td5 and it follows that the input/output transmission delay time is increased by the time delay td5.

In general (except a structure generating an iterative pulse in synchronization with an externally supplied clock signal as in the level shifting circuit 200 described with reference to FIG. 4), the iterative pulse and the input signal S1 are asynchronous and hence the input signal S1 is switched from an OFF command to an ON command at random when the internal OFF signal S3 based on the iterative pulse is valid, and consequently observed as a random jitter of the input/output transmission delay time.

While the input/output transmission delay time is increased if the input signal S1 is switched from an OFF command to an ON command when the internal OFF signal S3 based on the iterative pulse is valid, no time delay td5 is caused and the input/output transmission delay time is not increased also when the input signal S1 is switched from an OFF command to an OFF command if the internal OFF signal S3 based on the iterative pulse is not valid.

Figure 24:
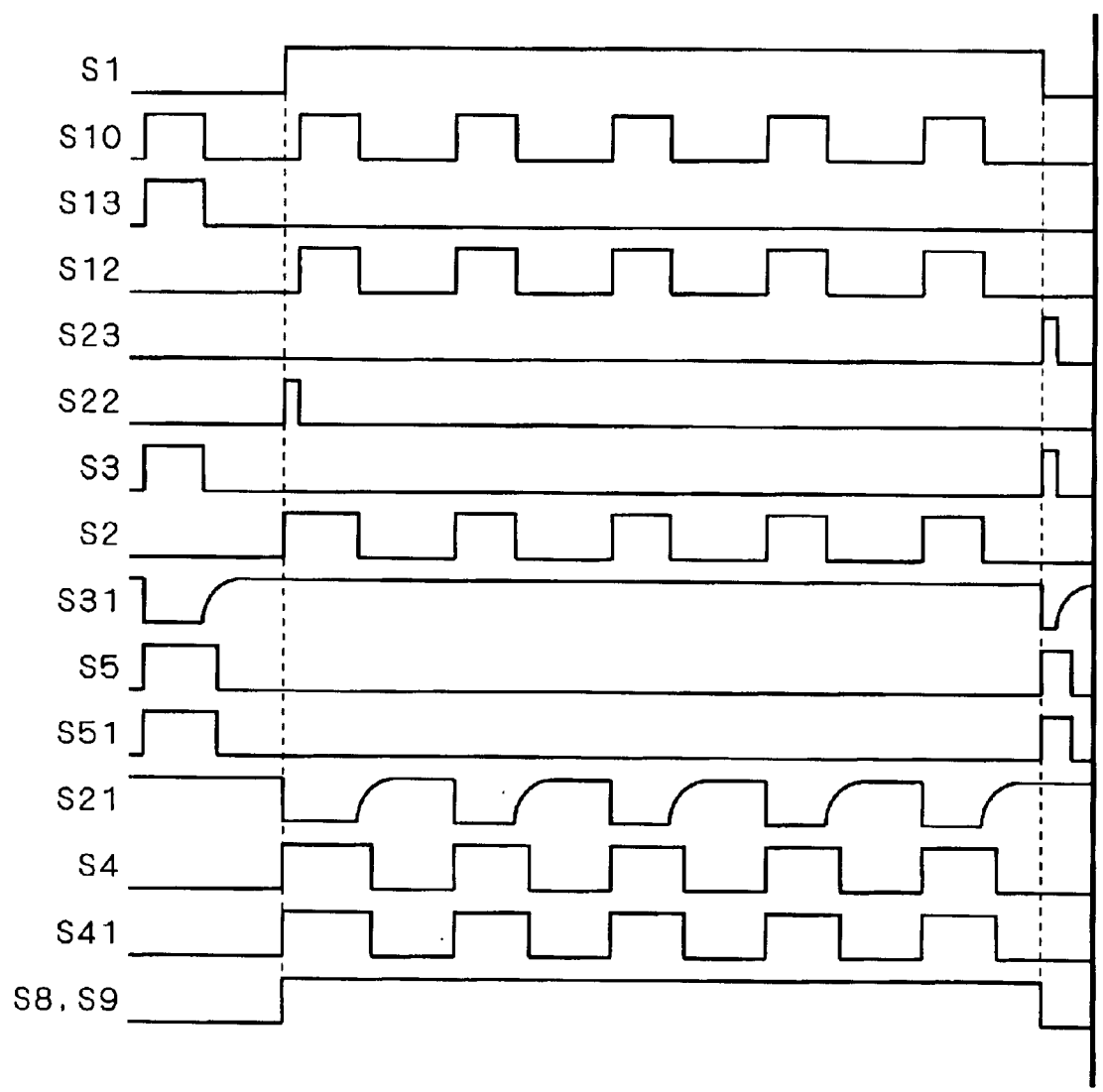

FIG. 24 shows a timing chart in a case where the input signal S1 is switched from an OFF command to an ON command when the internal OFF signal S3 based on the iterative pulse is not valid.

If the input signal S1 is switched from an OFF command to an ON command when the internal OFF signal S3 based on the iterative pulse not invalid (low), the internal ON signal S2 is rendered valid in synchronization therewith, as shown in FIG. 24. In this case, the valid states the internal ON signal S2 and the internal OFF signal S3 are not in proximity to each other, and hence the internal ON command signal S4 and the internal OFF command signal S5 are not simultaneously rendered valid.

<I-3. Device Structure>

As hereinabove described, a random jitter may be caused in the input/output transmission delay time due to the provision of the filter circuit 8, while such a random jitter may be caused in the input/output transmission delay time due to a latch operation of the SR flip-flop circuit 9 also in a structure having no filter circuit (such as the structure of the level shifting circuit 600 shown in FIG. 13).

A level shifting circuit 900 suppressing a jitter of an input/output transmission delay time is now described as an embodiment 9 of the present invention. The level shifting circuit 900, based on the level shifting circuit 600A shown in FIG. 21 in the following description, may alternatively be based on the level shifting circuit (such a level shifting circuit that the input signal S1 is switched asynchronously with the output signal S10 from the clock signal generation circuit 16 except the structure generating the iterative pulse in synchronization with the externally supplied clock signal as in the level shifting circuit 200 described with reference to FIG. 4) according to each of the embodiments 1 to 8 of the present invention, as a matter of course. The level shifting circuit 900 may not necessarily have a filter circuit 8.

Figure 25:
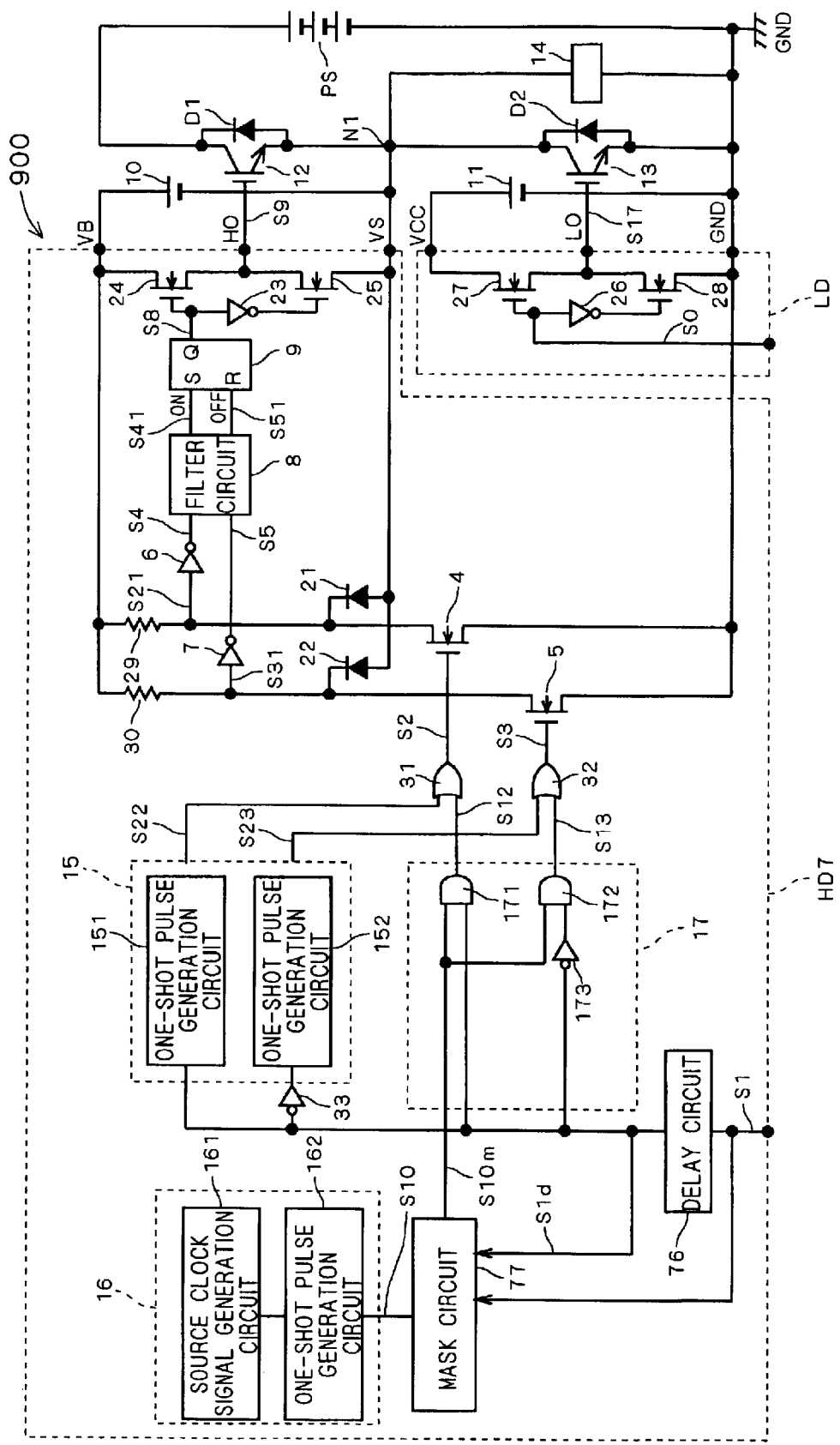
FIG. 25 illustrates the structure of a semiconductor device according to an embodiment 9 of the present invention.

FIG. 25 shows the structure of the level shifting circuit 900. Referring to FIG. 25, structures identical to those of the level shifting circuit 600A shown in FIG. 21 are denoted by the same reference numerals, to omit redundant description.

As shown in FIG. 25, the level shifting circuit 900 is divided into a high-potential side power device driving circuit HD7 and a low-potential side power device driving circuit LD, while the high-potential side power device driving circuit HD7 is further provided with a delay circuit 76 and a mask circuit 77 in a structure similar to that of the high-potential side power device driving circuit HD4A of the level shifting circuit 600A.

The delay circuit 76 delays an input signal S1 for generating a delayed input signal S1d, which in turn is supplied to an iterative pulse generation circuit 17, while the input signal S1 and the delayed input signal S1d are supplied to the mask circuit 77.

The mask circuit 77 has a function of receiving an output signal S10 from a clock signal generation circuit 16 and outputting a mask signal S10m generated by invalidating (masking) the valid signal S10 for a prescribed period on the basis of the input signal S1 and the delayed input signal S1d.

The delayed input signal S1d is input in an AND circuit 171, input in an AND circuit 172 through an inverter circuit 173, and supplied also to one-shot pulse generation circuits 151 and 152. The mask signal S10m is supplied to the AND circuits 171 and 172.

The delay circuit 76 and the mask circuit 77 adjusting the output signal S10 from the clock signal generation circuit 16 by masking etc. may also be referred to as clock signal adjusting means.

<I-4. Device Operation>

FIG. 26 is a timing chart illustrating operations of the level shifting circuit 900. Referring to FIG. 26, redundant description is omitted as to signals exhibiting operations similar to those of the level shifting circuit 600 described with reference to FIG. 13.

As shown in FIG. 26, the delayed input signal S1d has a time delay td6 with respect to the input signal S1, and the output signal S10 from the clock signal generation circuit 16 is rendered invalid (low) (may be also referred to as a silence state) for the period of the time delay td6 and output from the mask circuit 77 as the mask signal S10m.

Therefore, the input signal S1 is switched from an OFF command to an ON command when an internal OFF signal S3 based on the iterative pulse is valid. Also when switching timing for an internal OFF command signal S5 deviates from that for the internal OFF signal S3 by the time delay td5, valid states of an internal ON signal S2 and the internal OFF signal S3 are prevented from approaching to each other so that an internal ON command signal S4 and the internal OFF command signal S5 are not simultaneously rendered valid, i.e., set high, if the time delay td6 is set sufficiently longer than the time delay td5.

Assuming that time delay td5 is about 100 nsec., the time delay td6 is set to about 150 nsec. In this case, it can be said that the valid states of the internal ON signal S2 and the internal OFF signal S3 are separated from each other at a time interval of at least 150 nsec. While a desirable value for the time delay td6 varies with the device, the typical time delay td5 is about 100 nsec. and hence the time delay td6 is preferably at least 100 nsec.

Figure 27:
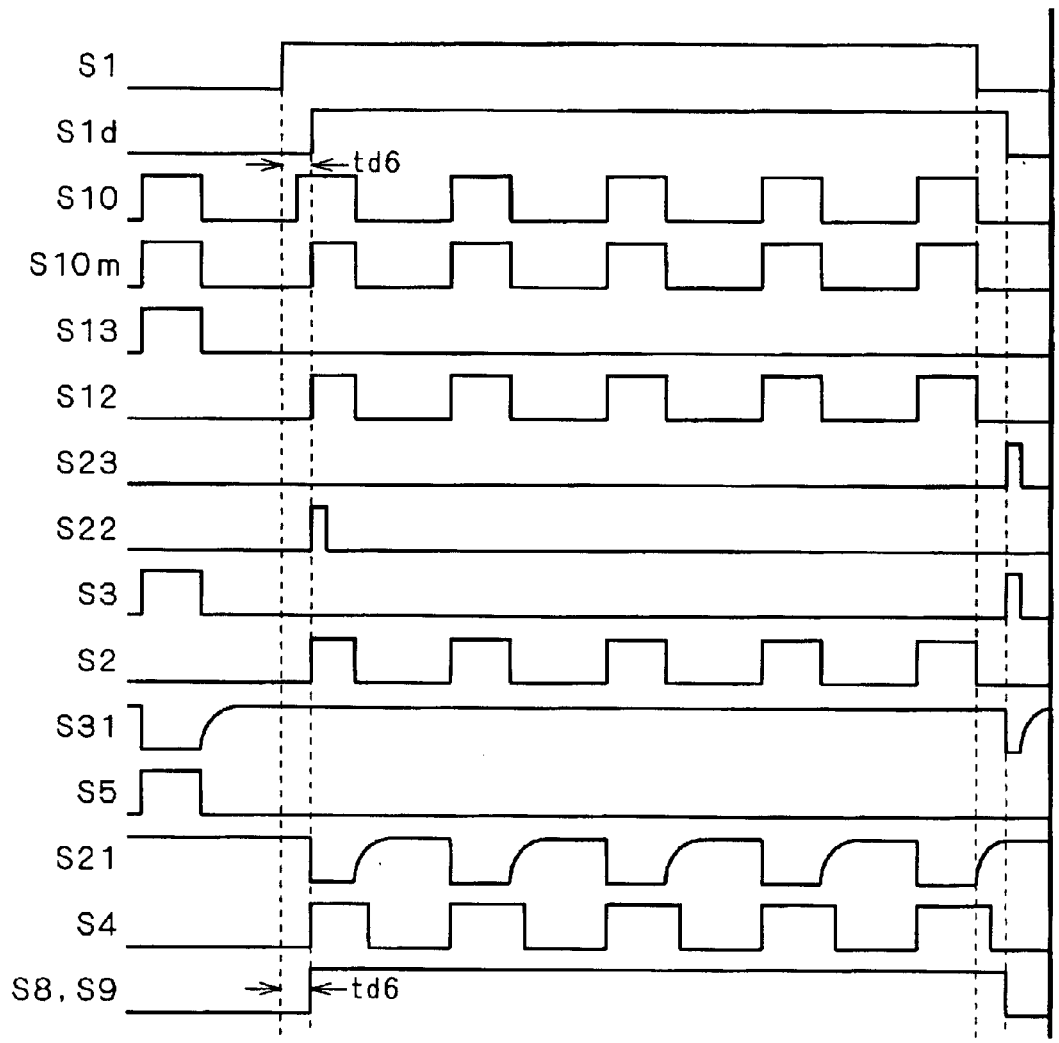

FIG. 27 shows a timing chart in a case where the input signal S1 is switched from an OFF command to an ON command when the internal OFF signal S3 based on the iterative pulse is not valid.

If the input signal S1 is switched from an OFF command to an ON command when the internal OFF signal S3 based on the iterative pulse is not valid (low), the internal ON signal S2 is rendered valid in synchronization therewith, as shown in FIG. 27. In this case, valid states of the internal ON signal S2 and the internal OFF signal S3 are not in proximity to each other, and hence the internal ON command signal S4 and the internal OFF command signal S5 are not simultaneously rendered valid.

Figure 28:
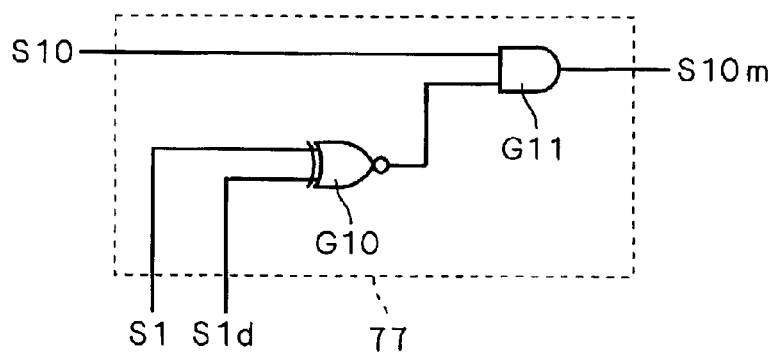
FIG. 28 illustrates the structure of a mask circuit.

FIG. 28 shows an exemplary structure of the mask circuit 77. As shown in FIG. 28, the mask circuit 77 has an exclusive NOR circuit G10 and an AND gate G11, so that the input signal S1 and the delayed input signal S1d are supplied to the exclusive NOR circuit G10, an output of the exclusive NOR circuit G10 and the output signal S10 from the clock signal generation circuit 16 are supplied to the AND circuit G11, and the AND circuit G11 outputs the mask signal S10m.

<I-5. Function/Effect>

In the level shifting circuit 900 according to the embodiment 9 of the present invention, as hereinabove described, the delay circuit 76 delays the input signal S1 for generating the delayed input signal S1d, generates the mask signal S10m by masking the output signal S10 from the clock signal generation circuit 16 for a prescribed period on the basis of the delayed input signal S1d and the input signal S1 and supplies the same to the iterative pulse generation circuit 17 not to simultaneously render the internal ON command signal S4 and the internal OFF command signal S5 valid, i.e., set high, whereby the input/output transmission delay time can be inhibited from occurrence of a random jitter.

An effect similar to the aforementioned effect can be attained by adding clock signal adjusting means performing prescribed processing on the output signal S10 from the clock signal generation circuit 16 to the level shifting circuit (except the structure generating the iterative pulse in synchronization with the externally supplied clock signal as in the level shifting circuit 200 described with reference to FIG. 4) according to each of the aforementioned embodiments 1 to 8 not to generate the iterative pulse signals S2 and S3 in proximity to each other in excess of a prescribed interval.

<I-6. Modification 1>

Figure 29:
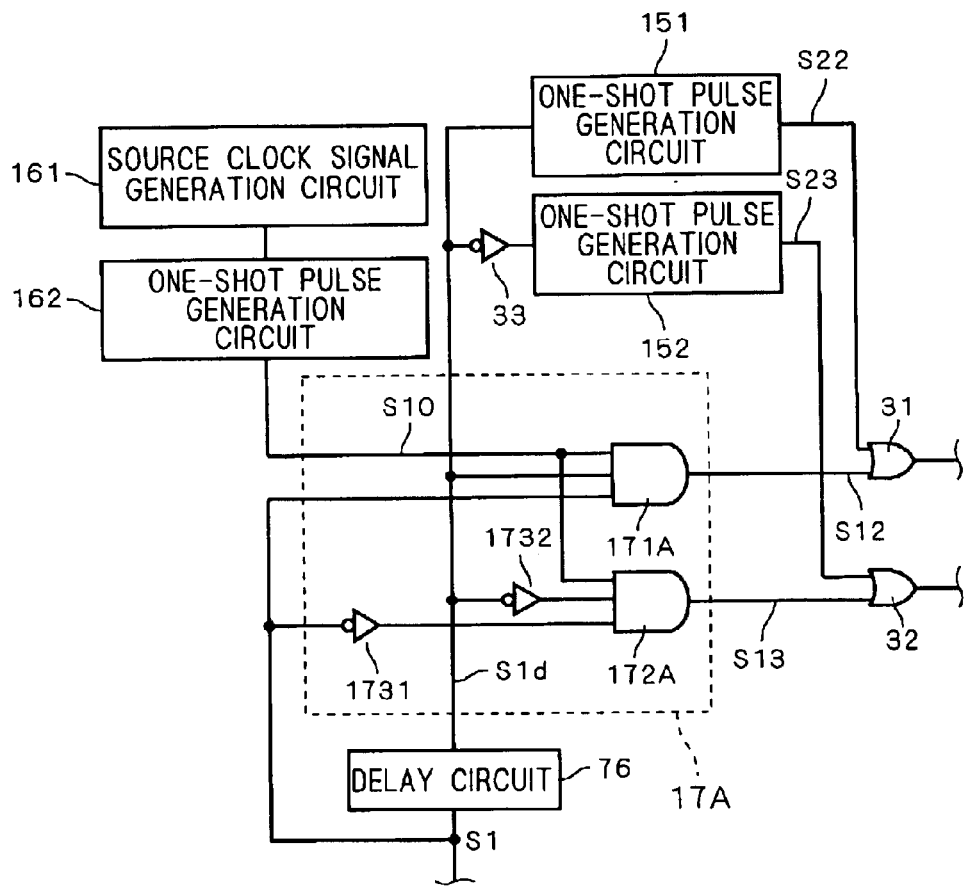
FIG. 29 illustrates the structure of a modification of the semiconductor device according to the embodiment 9 of the present invention.

While the mask circuit 77 generates the mask signal S10m by masking the output signal S10 from the clock signal generation circuit 16 by a prescribed period on the basis of the delayed input signal S1d and the input signal S1 in the aforementioned level shifting circuit 900 according to the embodiment 9 of the present invention, the circuit scale can be reduced by employing a structure shown in FIG. 29.

FIG. 29 shows the structure of an iterative pulse generation circuit 17A having the function of a mask circuit. The structure other than the iterative pulse generation circuit 17A is identical to that of the level shifting circuit 900 shown in FIG. 25, and illustration and redundant description thereof are omitted.

As shown in FIG. 29, the iterative pulse generation circuit 17A has two three-input AND circuits 171A an 172A, so that an output signal S10 from a clock signal generation circuit 16 is input in the AND circuits 171A and 172A while an input signal S1 is input in the AND circuit 171A and input in the AND circuit 172A through an inverter circuit 1731. A delayed input signal S1d output from a delay circuit 76 is input in the AND circuit 171A and input in the AND circuit 172A through an inverter circuit 1732.

Figure 30:
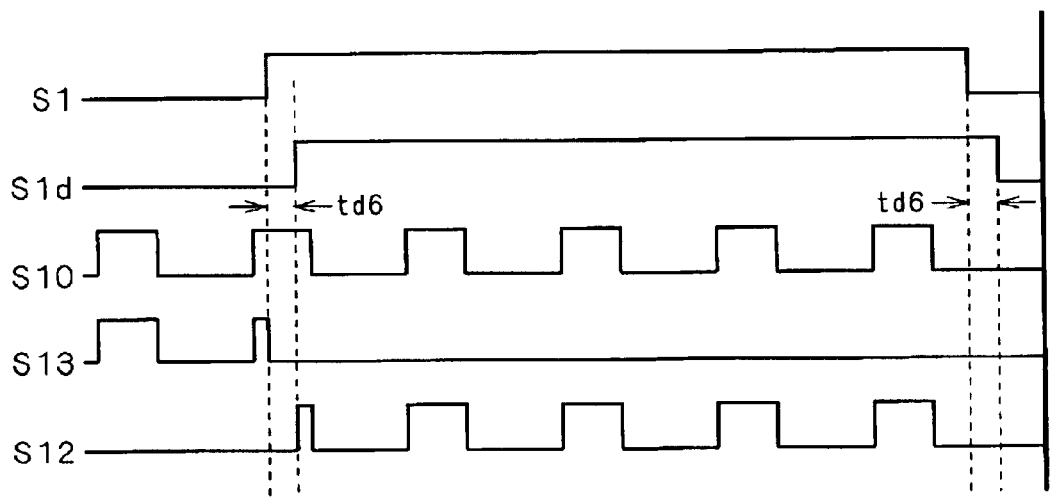
FIG. 30 is a timing chart illustrating operations of the modification of the semiconductor device according to the embodiment 9 of the present invention.

FIG. 30 is a timing chart illustrating operations of the iterative pulse generation circuit 17A.

As shown in FIG. 30, the delayed input signal S1d has a time delay td6 with respect to the input signal S1, the output signal S10 from the clock signal generation circuit 16 is substantially masked in a period (td6) when the input signal S1d is not switched from a low level to a high level even if the input signal S1 is switched from a low level to a high level, it follows that valid periods of output signals S12 and S13 from the AND circuits 171A and 172A are separated by the period of the time delay td6, valid states of an internal ON signal S2 and an internal OFF signal S3 are consequently not in proximity to each other, and an internal ON command signal S4 and an internal OFF command signal S5 are not simultaneously rendered valid.

When the structure shown in FIG. 29 is employed, the circuit scale can be reduced as compared with the level shifting circuit 900 shown in FIG. 25, whereby a time delay td5 can be reduced.

Mask functions included in the delay circuit 76 and the iterative pulse generation circuit 17A for adjusting the output signal S10 from the clock signal generation circuit 16 by masking etc. may also be referred to as clock signal adjusting means.

<I-7. Modification 2>

While the iterative pulse generation circuit 17A having the function of a mask circuit is employed in a modification 1 of the embodiment 9 of the present invention as hereinabove described, the number of gates passing the signal therethrough is different on leading and trailing edges of the input signal S1 in the structure shown in FIG. 29.

While the input signal S1 is input in an OR circuit 31 through an AND circuit 171A when the same rises, i.e., when an ON command is supplied, the input signal S1 is input in an OR circuit 32 through the inverter circuit 1732 and the AND circuit 172A when the input signal S1 falls, i.e., when an OFF command is supplied.

Therefore, it follows that the OFF command passes through a larger number of logic gates, and difference in relative transmission rate is caused between the ON command and the OFF command.

However, the difference in signal transmission rate can be eliminated by employing a structure shown in FIG. 31.

FIG. 31 shows the structure of an iterative pulse generation circuit 17B having the function of a mask circuit. As shown in FIG. 31, the iterative pulse generation circuit 17B has two three-input AND circuits 171A and 172A identically to the iterative pulse generation circuit 17A shown in FIG. 29, while an input signal S1 is input in the AND circuits 171A and 172A through an exclusive NOR circuit 174. The remaining structure of the iterative pulse generation circuit 17B is identical to that of the iterative pulse generation circuit 17A.

While operations of the iterative pulse generation circuit 17B are identical to those of the iterative pulse generation circuit 17A, the input signal S1 is input in an OR circuit 31 through the exclusive NOR circuit 174 and the AND circuit 171A when an ON command is supplied as the input signal S1 and the input signal S1 is input in an OR circuit 32 through the exclusive NOR circuit 174 and the AND circuit 172A when an OFF command is supplied, whereby the relative transmission rate for the input signal S1 can be rendered substantially identical for the ON command and the OFF command, and the difference in signal transmission rate can be eliminated.

Mask functions included in a delay circuit 76 and the iterative pulse generation circuit 17B for adjusting an output signal S10 from a clock signal generation circuit 16 by masking etc. may also be referred to as clock signal adjusting means.

<J. Embodiment 10>

In the aforementioned level shifting circuit 900 according to the embodiment 9 of the present invention, the delay circuit 76 delays the input signal S1 by the prescribed time (td5) and hence the input/output transmission delay time can be inhibited from a jitter, while the input/output transmission delay time is disadvantageously increased.

A level shifting circuit 1000 capable of inhibiting an input/output transmission delay time from a jitter and suppressing increase of the input/output transmission delay time is now described as an embodiment 10 of the present invention. The level shifting circuit 1000, based on the level shifting circuit 600A shown in FIG. 21 in the following description, may alternatively be based on the level shifting circuit (such a level shifting circuit that the input signal S1 is switched asynchronously with the output signal S10 from the clock signal generation circuit 16 except the structure generating the iterative pulse in synchronization with the externally supplied clock signal as in the level shifting circuit 200 described with reference to FIG. 4) according to each of the embodiments 1 to 8 of the present invention, as a matter of course. The level shifting circuit 1000 may not necessarily have a filter circuit 8.

<J-1. Device Structure>

Figure 32:
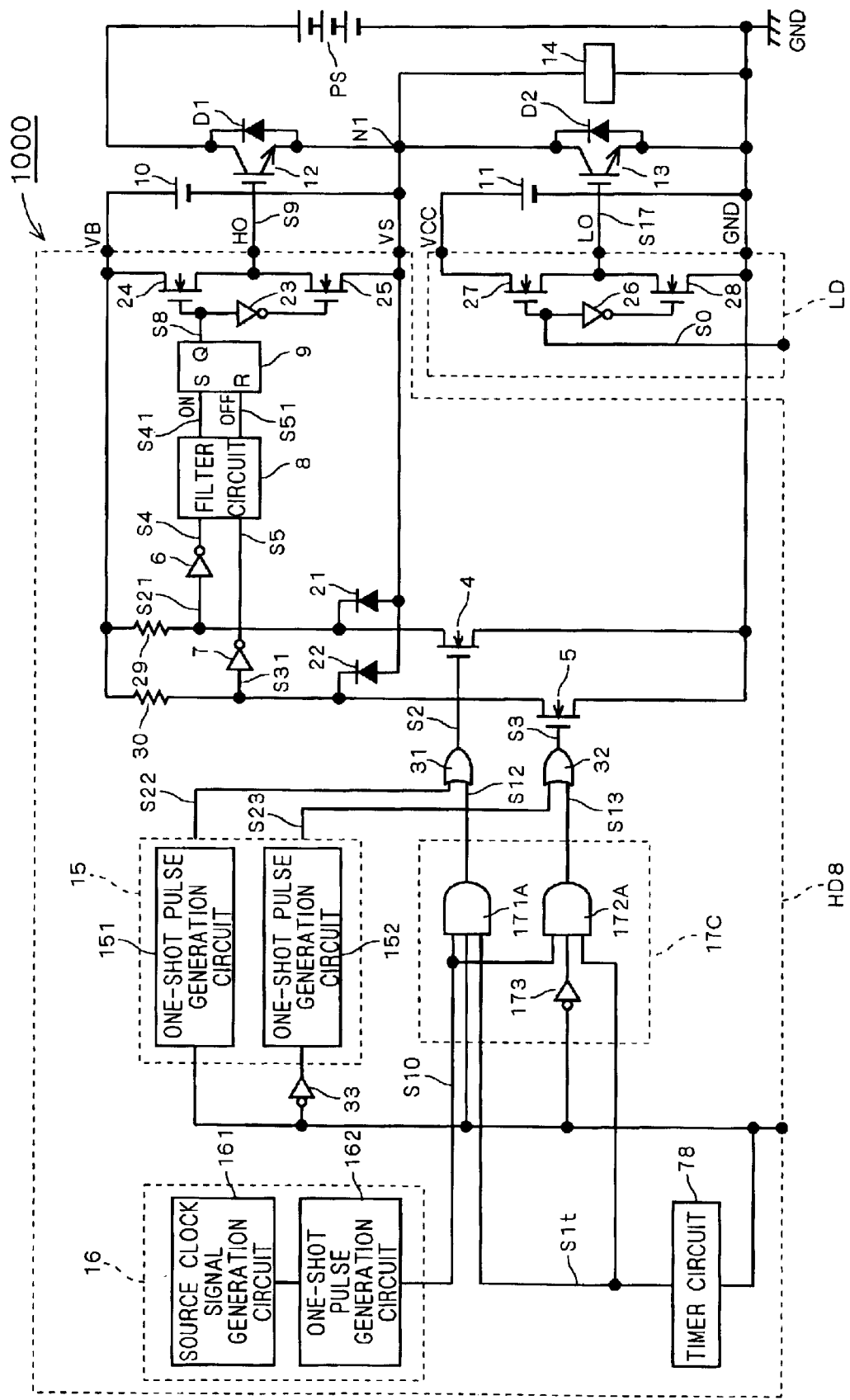
FIG. 32 illustrates the structure of a semiconductor device according to an embodiment 10 of the present invention.

FIG. 32 shows the structure of the level shifting circuit 1000. Referring to FIG. 32, structures identical to those of the level shifting circuit 600A shown in FIG. 21 are denoted by the same reference numerals, to omit redundant description.

As shown in FIG. 32, the level shifting circuit 1000 is divided into a high-potential side power device driving circuit HD8 and a low-potential side power device driving circuit LD, while the high-potential side power device driving circuit HD8 is further provided with a timer circuit 78 in a structure similar to that of the high-potential side power device driving circuit HD4A of the level shifting circuit 600A.

The timer circuit 78 has a function of receiving an input signal S1 and outputting a timer signal S1t rendered valid for a prescribed period when an ON command or an OFF command is supplied as the input signal S1. The timer signal S1t is supplied to an iterative pulse generation circuit 17C, for limiting valid states of iterative pulse output signals S12 and S13 output from the iterative pulse generation circuit 17C.

The iterative pulse generation circuit 17C has two three-input AND circuits 171A an 172A so that an output signal S10 from a clock signal generation circuit 16 is input in the AND circuits 171A and 172A while the input signal S1 is input in the AND circuit 171A and input in the AND circuit 172A through an inverter circuit 173. The timer signal S1t output from the timer circuit 78 is input in the AND circuits 171A and 172A.

<J-2. Device Operation>

Figure 33:
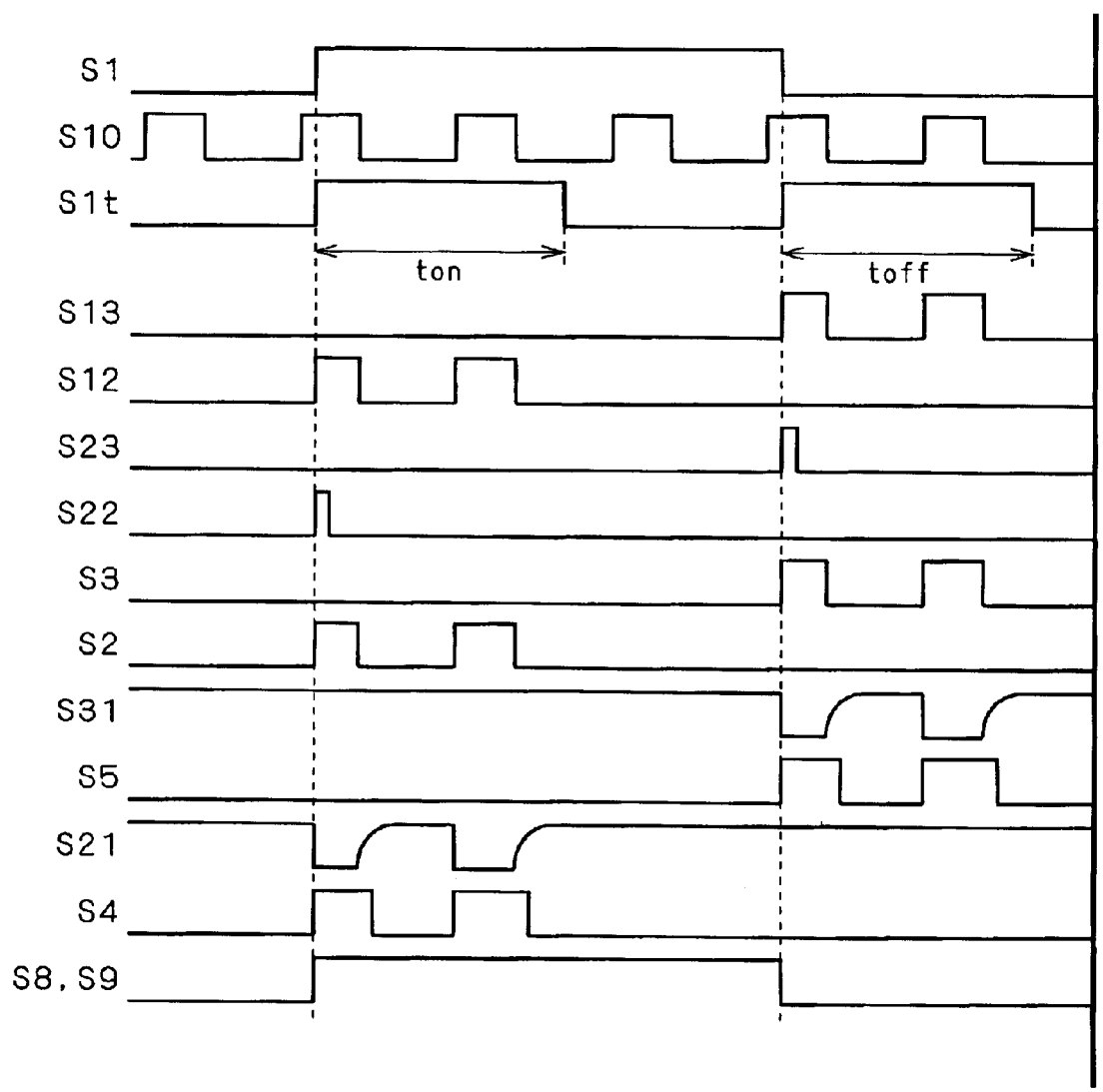
Figure 36:
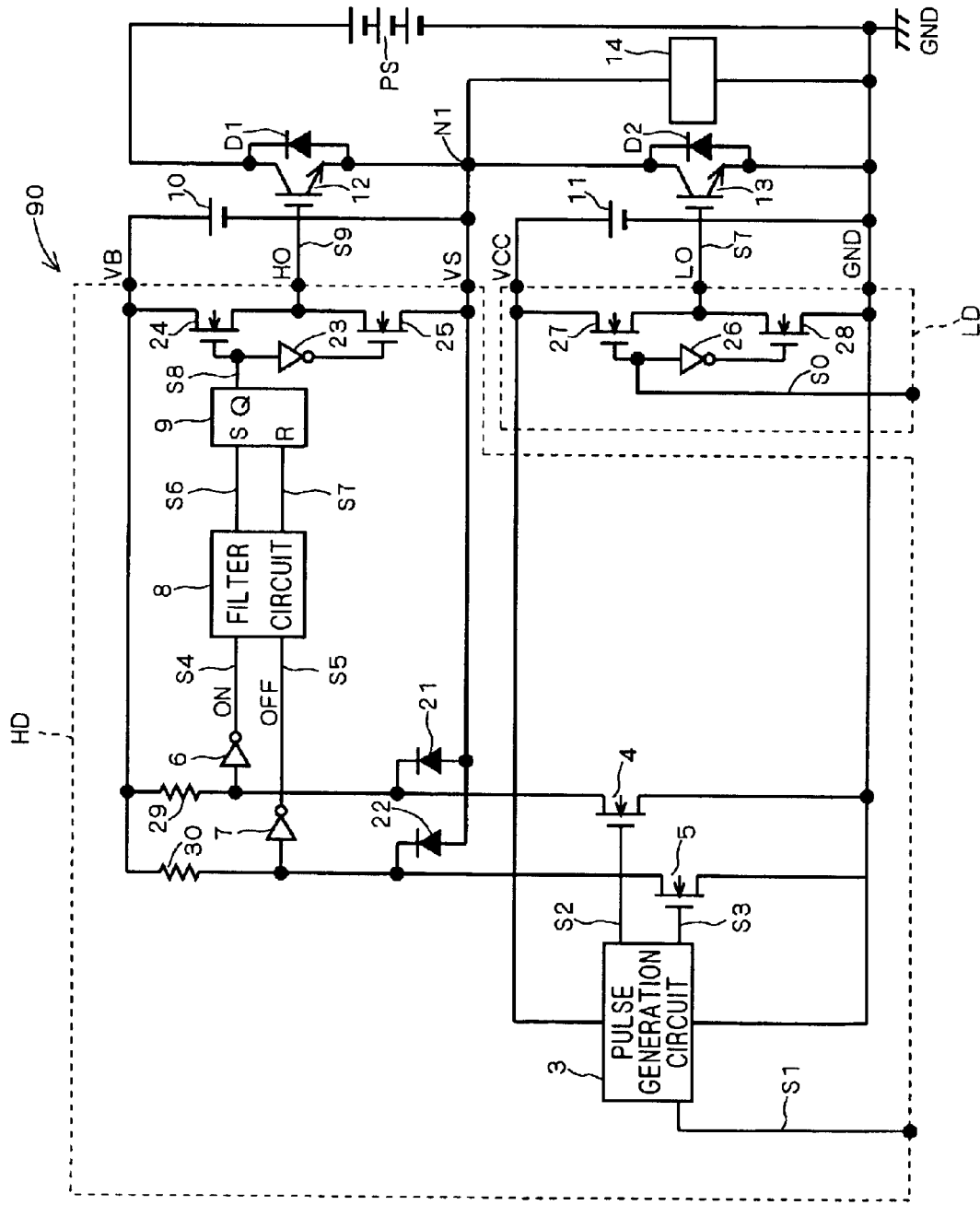
FIG. 36 illustrates the structure of a conventional semiconductor device.
Figure 37:
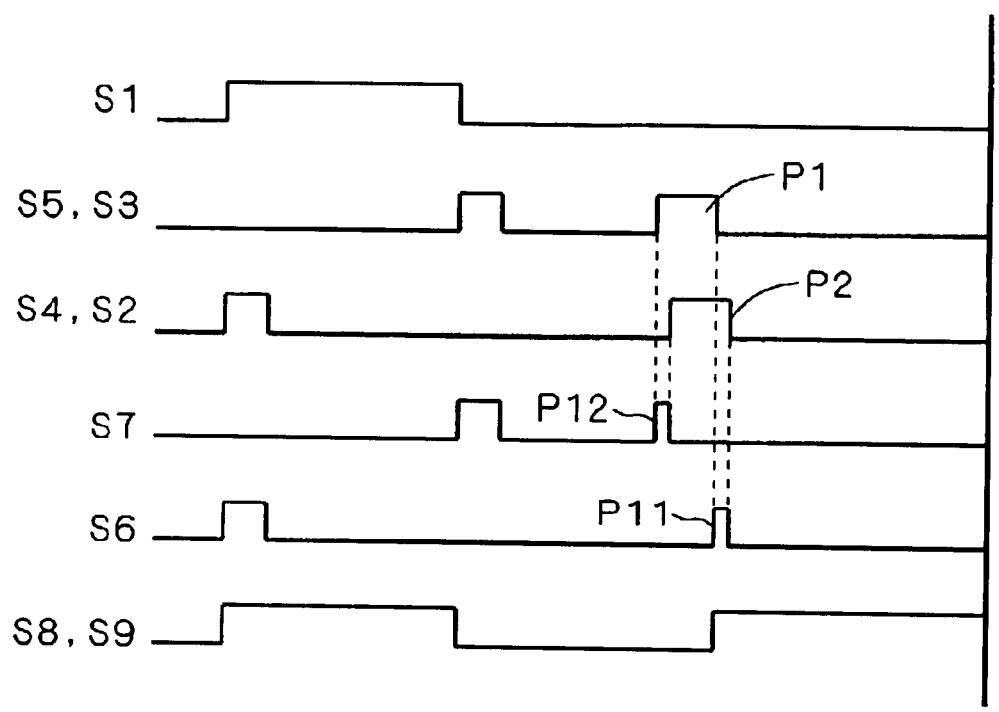
FIG. 37 is a timing chart illustrating operations of the conventional semiconductor device.

FIG. 33 is a timing chart illustrating operations of the level shifting circuit 1000. Referring to FIG. 33, redundant description is omitted as to signals exhibiting operations similar to those in the level shifting circuit 600 described with reference to FIG. 13.

When the input signal S1 is switched from an OFF command to an ON command if an internal OFF signal S3 based on an iterative pulse is valid, the timer signal S1t output from the timer circuit 78 is rendered valid (high) for a period ton and the iterative pulse generation circuit 17C outputs the signal S12 corresponding to the output signal S10 from the clock signal generation circuit 16 only in this period.

The timer signal S1t is rendered invalid (low) when the valid state thereof is terminated and the signal S12 remains invalid while the timer signal S1t is invalid, and hence the state (status) of the input signal S1 is not regularly transmitted but the level shifting circuit 1000 may be correctly referred to as a quasi-status system level shifting circuit.

FIG. 33 also illustrates such a state that the input signal S1 is switched from an ON command to an OFF command when the internal OFF signal S3 based on the iterative pulse is valid so that the timer signal S1t output from the timer circuit 78 is rendered valid by a period toff when the input signal S1 is switched from the ON command to the OFF command, and the iterative pulse generation circuit 17C outputs the signal S13 corresponding to the output signal S10 from the clock signal generation circuit 16 as the iterative pulse in this case.

FIG. 34 shows a timing chart in a case where the input signal S1 is switched from an OFF command to an ON command and from an ON command to an OFF command when the internal OFF signal S3 based on the iterative pulse is not valid.

When the input signal S1 is switched from the OFF command to the ON command when the internal OFF signal S3 based on the iterative pulse is not valid (low), the timer signal S1t output from the timer circuit 78 is rendered valid by the period ton in synchronization therewith and the iterative pulse generation circuit 17C outputs the signal S12 corresponding to the output signal S10 from the clock signal generation circuit 16 as the iterative pulse only in this period, as shown in FIG. 34. When the input signal S1 is switched from the ON command to the OFF command, the timer signal S1t output from the timer circuit 78 is rendered valid by the period toff, and the iterative pulse generation circuit 17C generates the signal S13 corresponding to the output signal S10 from the clock signal generation circuit 16 as the iterative pulse in this case.

Silence states are continuously present in the output signals S12 and S13 from the iterative pulse generation circuit 17C as hereinabove described and hence the probability for returning a power device from a malfunction to a correct operation when supplied with an error pulse resulting from a dv/dt transient signal is slightly reduced in calculation, while the error pulse resulting from the dv/dt transient signal has a high frequency of occurring immediately after switching of the input signal S1, i.e., immediately after switching of power devices 12 and 13, and hence no problem arises in practice when the valid periods ton and toff of the timer signal S1t are set to proper lengths.

The proper lengths of the valid periods ton and toff of the timer signal S1t are at least the width of the error pulse resulting from the dv/dt transient signal and less than the minimum input pulse width of the input signal S1. More specifically, the proper lengths may be set on the assumption that the width of the error pulse is about 100 nsec. and the minimum input pulse width is 300 nsec. to 1 $\mu$sec.

FIG. 35 shows an exemplary structure of the timer circuit 78. As shown in FIG. 35, the timer circuit 78 has two one-shot pulse generation circuits 781 and 782, an OR circuit 784 receiving outputs of the one-shot pulse generation circuits 781 and 782 and an inverter circuit 783 connected to an input of the one-shot pulse generation circuit 782, so that the input signal S1 is supplied to the one-shot pulse generation circuit 781 and supplied to the one-shot pulse generation circuit 782 through the inverter circuit 783. An output of the OR circuit 784 forms the timer signal S1t.

The one-shot pulse generation circuits 781 and 782 may be identical in structure to those described with reference to FIG. 14, for example, and the valid period for the timer signal S1t can be set by thresholds of inverter circuits G1 to G5 forming the one-shot pulse generation circuits 781 and 782 and the capacitance of a capacitor CP.

The timer circuit 78, limiting the output signal S10 from the clock signal generation circuit 16 processed by the iterative pulse generation circuit 17C with the timer signal S1t for limiting generation of the iterative pulse, may also be referred to as pulse control means.

<J-3. Function/Effect>

As hereinabove described, the level shifting circuit 1000 according to the embodiment 10 of the present invention renders the output signal S10 from the clock signal generation circuit 16 substantially invalid immediately before timing for switching the input signal S1 from an OFF command to an ON command and immediately before timing for switching the input signal S1 from an ON command to an OFF command, whereby valid states of an internal ON signal S2 and the internal OFF signal S3 are prevented from approaching to each other, and an internal ON command signal S4 and an internal OFF command signal S5 are not simultaneously rendered valid.

The timer signal S1t may alternatively be generated by counting the output signal S10 from the clock signal generation circuit 16 by a prescribed pulse number with a counter, in place of the timer circuit 78. In this case, the valid period for the timer signal S1t can be readily set.

An effect similar to the aforementioned effect can be attained by adding pulse control means controlling a pulse generation part to generate the signals S2 and S3 only immediately before the timing for switching the input signal S1 from an OFF command to an ON command and only by a prescribed period from timing for switching the input signal S1 from an ON command to an OFF command to the level shifting circuit (except the structure generating the iterative pulse in synchronization with the externally supplied clock signal as in the level shifting circuit 200 described with reference to FIG. 4) according to each of the aforementioned embodiments 1 to 8.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device driving/controlling first and second switching devices serially connected with each other and interposed between a high main power supply potential and a low main power supply potential, comprising:

a control part controlling conduction/non-conduction of a high-potential side switching device of either said first or second switching device;

a pulse generation part generating first and second iterative pulse signals in correspondence to first and second states of a first input signal having said first state indicating conduction of said high-potential side switching device and said second state indicating non-conduction of said high-potential side switching device, and said pulse generation part generates one of said first iterative pulse signal and said second iterative pulse signal only when the other of said first iterative pulse signal and said second iterative pulse signal is not generated; and a level shifting part level-shifting said first and second iterative pulse signals to a higher potential side for obtaining first and second level-shifted iterative pulse signals respectively, wherein said control part outputs a control signal rendering said high-potential side switching device conductive or non-conductive on the basis of said first and second level-shifted iterative pulse signals.

2. The semiconductor device according to claim 1, wherein said pulse generation part comprises:

a clock signal generation part generating a clock signal, and an iterative pulse generation part receiving said clock signal and said first input signal and outputting said clock signal as said first iterative pulse signal only in a period when said first input signal is in said first state while outputting said clock signal as said second iterative pulse signal only in a period when said first input signal is in said second state.

3. The semiconductor device according to claim 2, further comprising:

a logic circuit receiving said first and second level-shifted iterative pulse signals, operating the OR of said signals for reproducing said clock signal or an external clock signal and outputting the same as an internal clock signal.

4. The semiconductor device according to claim 2, wherein a second input signal controls conduction/non-conduction of a low-potential side switching device of either said first or second switching device, said semiconductor device further comprising:

a synchronous circuit receiving said clock signal or an external clock signal and said second input signal and outputting said second input signal as a synchronous control signal in synchronization with said clock signal or said external clock signal, for controlling conduction/non-conduction of said low-potential side switching device by said synchronous control signal.

5. The semiconductor device according to claim 1, wherein said pulse generation part comprises:

an iterative pulse generation part receiving an external clock signal and said first input signal and outputting said external clock signal as said first iterative pulse signal only in a period when said first input signal is in said first state while outputting said external clock signal as said second iterative signal only in a period when said first input signal is in said second state, and said first input signal is synchronous with said external clock signal.

6. The semiconductor device according to claim 5, further comprising:

a logic circuit receiving said first and second level-shifted iterative pulse signals, operating an OR of said signals for reproducing said clock signal or said external clock signal and outputting the same as an internal clock signal.

7. The semiconductor device according to claim 5, wherein a second input signal controls conduction/non-conduction of a low-potential side switching device of either said first or second switching device, said semiconductor device further comprising:

a synchronous circuit receiving said clock signal or said external clock signal and said second input signal and outputting said second input signal as a synchronous control signal in synchronization with said clock signal or said external clock signal, for controlling conduction/non-conduction of said low-potential side switching device by said synchronous control signal.

8. The semiconductor device according to claim 1, wherein said pulse generation part comprises:

a first oscillation circuit receiving said first input signal and outputting said first iterative pulse signal in synchronization with transition of said first input signal to said first state only in a period when said first input signal is in said first state, and a second oscillation circuit receiving said first input signal and outputting said second iterative pulse signal in synchronization with transition of said first input signal to said second state only in a period when said first input signal is in said second state.

9. The semiconductor device according to claim 1, wherein said pulse generation part comprises:

a clock signal generation part generating a clock signal, an iterative pulse generation part receiving said clock signal and said first input signal and outputting said clock signal as a first signal only in a period when said first input signal is in said first state while outputting said clock signal as a second signal only in a period when said first input signal is in said second state, a first one-shot pulse generation circuit receiving said first input signal and outputting a third signal having a pulse synchronized with transition of said first input signal to said first state in each cycle of said first input signal, a second one-shot pulse generation circuit receiving an inverted signal of said first input signal and outputting a fourth signal having a pulse synchronized with transition of said first input signal to said second state in each cycle of said first input signal, a first logic circuit receiving said first and third signals, operating a first OR of said signals and outputting the same as said first iterative pulse signal, and a second logic circuit receiving said second and fourth signals, operating a second OR of said signals and outputting the same as said second iterative signal.

10. The semiconductor device according to claim 1, wherein said pulse generation part comprises:

a clock signal generation part generating a clock signal, an iterative pulse generation part receiving said clock signal and said first input signal and outputting said clock signal as a first signal only in a period when said first input signal is in said first state while outputting said clock signal as a second signal only in a period when said first input signal is in said second state, a latch circuit receiving said clock signal and said first input signal and having a first output end set in synchronization with transition of said first input signal to said first state and a second output end set in synchronization with transition of said first input signal to said second state while said first and second output ends are reset in synchronization with said clock signal, a first logic circuit receiving said first signal and a third signal output from said first output end, operating a first OR of said signals and outputting the same as said first iterative pulse signal, and a second logic circuit receiving said second signal and a fourth signal output from said second output end, operating a second OR of said signals and outputting the same as said second iterative pulse signal.

11. The semiconductor device according to claim 1, wherein said pulse generation part comprises:

a clock signal generation part generating a clock signal, an iterative pulse generation part receiving said clock signal and said first input signal and outputting said clock signal as a first signal only in a period when said first input signal is in said first state while outputting said clock signal as a second signal only in a period when said first input signal is in said second state, a latch circuit receiving said clock signal and said first input signal and having a first output end set in synchronization with transition of said first input signal to said first state and a second output end set in synchronization with transition of said first input signal to said second state while said first and second output ends are reset in synchronization with said clock signal, a first logic circuit receiving said first signal and a third signal output from said first output end, operating a first OR of said signals and outputting the same as a fifth signal, a second logic circuit receiving said second signal and a fourth signal output from said second output end, operating a second OR of said signals and outputting the same as a sixth signal, a first one-shot pulse generation circuit receiving said fifth signal, reducing a first duty ratio of a pulse included in said fifth signal and outputting the same as said first iterative pulse signal, and a second one-shot pulse generation circuit receiving said sixth signal, reducing a second duty ratio of a pulse included in said sixth signal and outputting the same as said second iterative pulse signal.

12. The semiconductor device according to claim 1, further comprising clock signal adjusting means performing prescribed processing on said clock signal so that said first and second iterative pulse signals are not generated in proximity to each other in excess of a prescribed interval.

13. The semiconductor device according to claim 12, further comprising a filter circuit arranged on a front stage of said control part, wherein said filter circuit supplies a prescribed signal to said control part to continuously output immediately preceding said control signal in a period when said first and second level-shifted iterative pulse signals are simultaneously input.

14. The semiconductor device according to claim 1, further comprising a filter circuit arranged on a front stage of said control part, wherein said filter circuit supplies a prescribed signal to said control part to continuously output immediately preceding said control signal in a period when said first and second level-shifted iterative pulse signals are simultaneously input.

15. The semiconductor device according to claim 9, further comprising clock signal adjusting means performing prescribed processing on said clock signal so that said first and second iterative pulse signals are not generated in proximity to each other in excess of a prescribed interval.

16. The semiconductor device according to claim 15, wherein said clock signal adjusting means includes:

a delay circuit receiving said first input signal, supplying a prescribed delay for forming a delayed input signal and supplying the same to at least said iterative pulse generation part and said first and second one-shot pulse generation circuits in place of said first input signal, and a mask circuit receiving said clock signal and masking valid said clock signal by a prescribed period corresponding to the period of said prescribed delay on the basis of said first input signal and said delayed input signal for supplying the same to said iterative pulse generation part as a mask signal.

17. The semiconductor device according to claim 15, wherein said clock signal adjusting means includes a delay circuit receiving said first input signal, supplying a prescribed delay for forming a delayed input signal and supplying the same to said iterative pulse generation part and said first and second one-shot pulse generation circuits, and said iterative pulse generation part receives said clock signal, said first input signal and said delayed input signal and separates the intervals for generating said first and second iterative pulse signals by said prescribed period.

18. The semiconductor device according to claim 9, further comprising a filter circuit arranged on a front stage of said control part, wherein said filter circuit supplies a prescribed signal to said control part to continuously output immediately preceding said control signal in a period when said first and second level-shifted iterative pulse signals are simultaneously input.

19. The semiconductor device according to claim 1, further comprising pulse control means controlling said pulse generation part to generate said first and second iterative pulse signals only for a prescribed period from transition of said first input signal to said second state and from transition to said first state.

20. The semiconductor device according to claim 9, further comprising pulse control means controlling said pulse generation part to generate said first and second iterative pulse signals only for a prescribed period from transition of said first input signal to said second state and from transition to said first state.

* * * * *

UNITED STATES PATENT AND TRADEMARK OFFICE
CERTIFICATE OF CORRECTION

PATENT NO. : 6,774,674 B2
DATED : August 10, 2004
INVENTOR(S) : Jeffrey A. Kash et al.

It is certified that error appears in the above-identified patent and that said Letters Patent is hereby corrected as shown below:

Column 9,
Line 24, "represent" should be -- present --
Line 29, delete "a"

Signed and Sealed this

Twenty-sixth Day of April, 2005

JON W. DUDAS
*Director of the United States Patent and Trademark Office*

UNITED STATES PATENT AND TRADEMARK OFFICE
CERTIFICATE OF CORRECTION

PATENT NO.   : 6,774,674 B2
DATED        : August 10, 2004
INVENTOR(S)  : Kazuaki Okamoto et al.

It is certified that error appears in the above-identified patent and that said Letters Patent is hereby corrected as shown below:

This certificate supersedes Certificate of Correction issued April 26, 2005, the number was erroneously mentioned and should be vacated since no Certificate of Correction was granted.

Signed and Sealed this

Twenty-eighth Day of June, 2005

JON W. DUDAS
*Director of the United States Patent and Trademark Office*